United States Patent
Ito et al.

(10) Patent No.: US 7,009,828 B2
(45) Date of Patent: Mar. 7, 2006

(54) SEMICONDUCTOR SWITCHING DEVICE

(75) Inventors: Hiroshi Ito, Tokyo (JP); Akihiko Iwata, Tokyo (JP); Akihiro Suzuki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 163 days.

(21) Appl. No.: 10/463,813

(22) Filed: Jun. 18, 2003

(65) Prior Publication Data

US 2003/0210509 A1 Nov. 13, 2003

Related U.S. Application Data

(63) Continuation of application No. 09/986,326, filed on Nov. 8, 2001, now Pat. No. 6,639,767.

(30) Foreign Application Priority Data

| Nov. 13, 2000 | (JP) | 2000-345303 |
| Sep. 3, 2001 | (JP) | 2001-265502 |

(51) Int. Cl.
*H02H 3/20* (2006.01)

(52) U.S. Cl. .................... 361/91.8; 361/91.7
(58) Field of Classification Search .......... 361/91.1, 361/91.2, 91.3, 91.4, 91.5, 91.6, 91.7, 91.8, 361/93.7–93.9, 100, 101, 93, 98; 363/58, 363/98, 132

See application file for complete search history.

(56) References Cited

U.S. PATENT DOCUMENTS

| 4,594,634 A | * | 6/1986 | Schminke | 361/100 |
| 5,051,603 A | | 9/1991 | Walker | |
| 5,155,673 A | * | 10/1992 | Takahashi et al. | 363/54 |
| 5,424,937 A | | 6/1995 | Iyotani et al. | |
| 5,455,757 A | * | 10/1995 | Nguyen et al. | 363/21.16 |
| 5,461,556 A | | 10/1995 | Horie et al. | |
| 6,043,636 A | * | 3/2000 | Gaudreau et al. | 323/282 |
| 6,304,475 B1 | * | 10/2001 | Iwata et al. | 363/132 |

FOREIGN PATENT DOCUMENTS

| JP | 5-276650 | 10/1993 |
| JP | 7-288456 | 10/1995 |
| JP | 9-275674 | 10/1997 |
| JP | 2000-232771 | 8/2000 |

OTHER PUBLICATIONS

Ito et al.; "Novel Low Loss Active Voltage Clamp Circuit for Series Connection Of GCT thyristors", $33^{rd}$ IEEE Power Electronics Specialists Conference, Jun. 23–27, 2002, Cairns, Australia.

* cited by examiner

*Primary Examiner*—Brian Sircus
*Assistant Examiner*—Danny Nguyen
(74) *Attorney, Agent, or Firm*—Leydig, Voit & Mayer, Ltd.

(57) ABSTRACT

Self-quenching switching elements are connected in series in a semiconductor switching device. Snubber circuits including a diode, a capacitor, and a non-linear circuit are connected in parallel with the respective semiconductor switching elements. In the snubber circuit, the diode and the capacitor are connected in series, and the non-linear circuit is connected in parallel with the capacitor. The non-linear circuit includes an impedance element, a Zener diode, and a controlling semiconductor element and draws current through the controlling semiconductor element when applied voltage exceeds the Zener voltage of the Zener diode. The Zener voltage is larger than a divided voltage applied to the semiconductor element during a fault in a power system.

6 Claims, 23 Drawing Sheets

DIVIDED VOLTAGE Vo    CLAMP VOLTAGE V₁

VOLTAGE OF SEMICONDUCTOR SWITCHING ELEMENT

CLAMP VOLTAGE V2

DIVIDED VOLTAGE Vo

DIVIDED VOLTAGE Vo

DIVIDED VOLTAGE Vo

SEMICONDUCTOR SWITCHING DEVICE

FIELD OF THE INVENTION

The present invention relates to a semiconductor switching device used, for example, for a converter in a power system to convert AC to DC and vise versa.

BACKGROUND OF THE INVENTION

A conventional semiconductor switching device, such as described in Japanese Unexamined Patent Publication No. 33,001/1999, is shown in FIG. 26. Although a semiconductor switching device typically comprises semiconductor switching elements connected in series and parallel, only one of them is shown in FIG. 26. As shown in FIG. 26, a reverse-conducting diode 3 is connected to a semiconductor switching element 2 to produce a reverse-conducting switching element 1. Moreover, a snubber circuit 10 is connected to the reverse-conducting switching element 1. In a semiconductor switching device in which reverse-conducting switching elements 1 are connected in series and parallel, each reverse-conducting switching element 1 is called a series valve and each reverse-conducting switching element 1 with the snubber circuit 10 is called a stage.

In a snubber circuit of FIG. 26, 4 denotes the first diode, 5 denotes the first capacitor, 6 denotes the first impedance element, 7(7a, 7b) denotes the first Zener diode, 8(8a, 8b) denotes the first resistor, and 9(9a, 9b) denotes the first controlling semiconductor element. The first impedance element 6, the first controlling semiconductor elements 9, the first resistors 8, and the first Zener diode 7 comprise a non-linear circuit 16. In FIG. 26, moreover, 12 denotes a gate drive circuit to drive the semiconductor switching element 2, 13 denotes an input terminal to apply a control signal for the gate drive circuit 12, and 33 denotes a power supply for the gate drive circuit.

In the semiconductor switching device in which the stages as shown in FIG. 26 are connected in series, overvoltage may be applied to a semiconductor switching element 2 mainly by following three causes.

Firstly, overvoltage is caused by asynchronous turn on/off operation among the semiconductor switching elements. If a semiconductor switching element 2 turns on later than the others, overvoltage is applied to this semiconductor switching element, turning on late. If a semiconductor switching element 2 turns off earlier than the others, an overvoltage is applied to this semiconductor switching element, turning off early.

Secondly, overvoltage is also caused by inductance of circuits connected thereto. When the semiconductor switching elements turns off, variation in current generates an electromotive force across the inductance of the circuits. This electromotive force is added to the semiconductor switching elements, whereby each semiconductor switching element is charged with the overvoltage at the same time.

Thirdly, in a semiconductor switching device in which semiconductor switching elements are connected in series, leakage current of each semiconductor switching element probably varies so that divided voltage for each semiconductor switching element also varies. Therefore, some semiconductor switching elements are charged with higher voltage than the other semiconductor switching elements, that is, overvoltage.

When overvoltage is caused and applied to the semiconductor switching element 2 in the semiconductor switching device as shown in FIG. 26, electric charge for this overvoltage flows through the first diode 4 into the first capacitor 5. If, thereby, voltage of the first capacitor 5 exceeds a Zener voltage determined by the first Zener diode 7(7a, 7b), current is drawn through the first impedance element 6 and the first controlling semiconductor element 9(9a, 9b) so that the voltage of the first capacitor 5 is decreased to the Zener voltage and the semiconductor switching element 2 is protected from the overvoltage.

By the way, if a voltage equal to or just above the normal voltage for each stage is chosen as the Zener voltage of the Zener diode 9(9a, 9b), a slight overvoltage easily exceeds the Zener voltage and current continuously flows through the first controlling semiconductor element 9(9a, 9b) so that the first controlling semiconductor element 9 (9a, 9b) may be thermally destroyed. While, if voltage considerably higher than the normal voltage is chosen as the Zener voltage, unevenness in applied voltage among the stages, which is caused by uneven leakage current among the semiconductor switching elements 2 in the off state, is not compensated until the highest voltage among semiconductor switching elements 2 reaches this considerably high Zener voltage. Therefore, compensation to apply equal voltage for each semiconductor element 2 cannot be achieved.

Moreover, in case a semiconductor switching device is constructed from a large number of semiconductor switching elements 2 connected in series and parallel, a power supply 33 for a gate drive circuit 12 is required for each semiconductor element 2 so that the semiconductor switching device as a whole becomes complicated and manufacturing cost thereof rises.

As described above, electromotive force across the inductance of the circuits is generated by turn off of the semiconductor switching elements 2 and, thereby, current flows into the first capacitor 5. During the current flows into the first capacitor 5, power is also supplied from the power source to the first capacitor 5. Therefore, the current caused by the electromotive force of inductance and the current from the power source flowing together with the current are stored in the first capacitor 5 and lost at the snubber circuit 10.

By setting an upper limit voltage of the first capacitor 5, i.e., the Zener voltage of the Zener diode 7(7a, 7b), above the normally applied voltage of each semiconductor switching element 2, the current from the power source toward the first capacitor 5, which originates from the electromotive force at the inductance, hardly flows. Thus, the term in which the current flows is shortened so that energy from the power source supplied to the first capacitor 5 is reduced.

As described above, by setting the voltage of the first capacitor 5 higher than the normally applied voltage of each semiconductor switching element 2, loss in the snubber circuit 10 is reduced. However, if the voltage of the first capacitor 5 is set too high, protection for the semiconductor elements 2 becomes insufficient so that breakdown of the semiconductor elements 2 may be caused. In contrast, if voltage of the first capacitor 5, i.e., the Zener voltage of the Zener diode 7(7a, 7b), is set too small, the voltage applied to each semiconductor element 2 easily exceeds the Zener voltage by a slight increase thereof due to an accident or the like in the power system and, thereby, current continuously flows through the Zener diode 7(7a, 7b) so that the Zener diode 7(7a, 7b) may be thermally destroyed.

Moreover, when a higher Zener voltage is chosen to reduce loss in the snubber circuit 10, unevenly divided voltages among the semiconductor switching elements 2 in their off state hardly exceed this higher Zener voltage so that compensation to apply equal voltage for each semiconductor element 2 in off state cannot be achieved.

Furthermore, especially in a semiconductor switching device in which a large number of the semiconductor switching elements 2 are connected in series to convert very high voltage, a power supply 33 to supply adequate voltage for a gate drive circuit 12 of each semiconductor switching element 2 becomes complicated and costly.

SUMMARY OF THE INVENTION

Therefore, in the first aspect of the present invention, switching elements of self-quenching function are connected in series to constitute a bridge arm, and at least two bridge arms are connected in parallel to constitute a high voltage semiconductor switching device. Moreover, a snubber circuit comprising a first diode, a first capacitor and a non-linear circuit is connected in parallel to the respective semiconductor switching element. In the snubber circuit, the first diode and the first capacitor are connected in series, and the non-linear circuit is connected in parallel to the first capacitor. The non-linear circuit comprises a impedance element, a non-linear circuit element such as Zener diode, and a controlling semiconductor element and draws current through the controlling semiconductor element when applied voltage exceeds the Zener voltage of the Zener diode, and said Zener voltage is larger than and has minimum latitude to divided voltage of the semiconductor element under an accident in power system.

In the semiconductor switching device according to the first aspect of the present invention, overvoltage caused by asynchronous turn on/off among the semiconductor switching elements can be absorbed into the snubber circuit and, at the same time, loss at the snubber circuit can be reduced. Moreover, even if voltage of power source rises by an accident such as short circuit in a load connected thereto to raise divided voltage of the semiconductor switching element, the semiconductor switching element as well as the snubber circuit is protected and never be broken.

In the second aspect of the present invention, with considering our research showing that the rise in voltage of power source under the accident is 1.27 times at maximum, clamp voltage at which the non-linear circuit begins to draw the current is set to approximately 1.3 times larger than normal divided voltage of the semiconductor switching element.

In the non-linear circuit of the semiconductor switching device according to the third aspect of the present invention, cathode and anode of the first Zener diode are connected to collector and gate of the first controlling semiconductor element respectively, the first resistor is connected between gate and emitter of the first controlling semiconductor element, and impedance of the first impedance element or number of the first controlling semiconductor elements is adjusted with which loss at the first controlling semiconductor element owing to the current, which flows through the first controlling semiconductor element when divided voltage of the semiconductor switching element under an accident in power system exceeds the clamp voltage, does not exceed capacity of the first controlling element.

In the semiconductor switching device according to the third aspect of the present invention, even if one or more semiconductor switching element is broken so that divided voltage of the other semiconductor switching element rises and, in addition, some accident happens so that the voltage of power source rises, thermal heat at the first controlling semiconductor element can be reduced by enlarging impedance of the first impedance element to reduce current flowing into the non-linear unit or by increasing the number of the first controlling semiconductor elements to reduce thermal heat for each first controlling semiconductor element. Thereby, the first controlling semiconductor element is protected from to be broken.

In the semiconductor switching device according to the fourth aspect of the present invention, a second impedance element having resistance, a second Zener diode comprising Zener diodes and a second resister are connected in series and connected parallel to the semiconductor switching element. Moreover, a second controlling semiconductor element, which draws current when voltage applied to the semiconductor switching element exceeds Zener voltage of the second Zener diode, is provided in a manner such that collector and gate thereof are connected to cathode and anode of the second Zener diode respectively, and said second resistor is connected between gate and emitter thereof.

In the semiconductor switching element in which large number of the semiconductor switching elements are connected in series, the leakage current of each semiconductor switching element is uneven so that the normal divided voltage for the semiconductor switching element of larger leakage current becomes lower and the normal divided voltage for the semiconductor switching element of smaller leakage current becomes higher. However, in the semiconductor switching device according to the fourth aspect of the present invention, current is drawn through said circuit in accordance with raised normal divided voltage owing to the unevenness in the leakage current. Consequently, normal divided voltage of each semiconductor switching element is almost equalized regardless of individual characteristics thereof.

In the semiconductor switching device according to the fifth aspect of the present invention, the non-linear circuit comprises a first impedance element and non-linear units. A second impedance element connects high voltage side of the semiconductor switching element to connecting point between the non-linear units, or low voltage side of the semiconductor switching element to connecting point between the non-linear units.

In the semiconductor switching element in which large number of the semiconductor switching elements are connected in series, the leakage current of each semiconductor switching element is uneven so that the normal divided voltage for each semiconductor switching element is also uneven. Therefore, the semiconductor switching device according to the fifth aspect of the present invention compensates this unevenness of the leakage current to equalize the normal divided voltage among the semiconductor switching elements. The normal divided voltage for the semiconductor switching element of larger leakage current is lower and the normal divided voltage for the semiconductor switching element of smaller leakage current is higher. The non-linear units detects this higher normal divided voltage and draw current therethrough additionally to the leakage current through the semiconductor switching element.

In the semiconductor switching device according to the sixth aspect of the present invention, the second impedance element connects high voltage side of the semiconductor switching element to connecting point between the non-linear units, and the second impedance element itself comprises a third diode and a third resistor connected in series.

In the semiconductor switching device according to the sixth aspect of the present invention, the third resistor controls and adjusts current flowing through the second impedance element to make the normal divided voltage more closer to the ideal equally divided voltage.

In the semiconductor switching device according to the seventh aspect of the present invention, the first Zener diode or the second Zener diode is selected to make the second clamp voltage determined by the non-linear unit, which is connected to the second impedance element with cathode of the Zener diode thereof, lower than the normal divided voltage of the semiconductor switching element.

In the semiconductor switching device according to the seventh aspect of the present invention, since the second clamp voltage or Zener voltage determined by the first Zener diode or the second Zener diode is lower than the normal divided voltage of the semiconductor switching element, the applied voltage of the semiconductor switching element higher than or closer to the equally divided voltage is detected so that compensating current is drawn through the second impedance element to make the normal divided voltage closer to the equally divided voltage.

In the semiconductor switching device according to the eighth aspect of the present invention, the second impedance element is not provided for at least one semiconductor switching element in which resistance or normal divided voltage in off state thereof is smaller than the other semiconductor switching elements.

In the semiconductor switching device according to the eighth aspect of the present invention, since necessity to flow the compensating current is small for the semiconductor switching element of smallest resistance or smallest normal divided voltage, the second impedance element there of can be omitted.

In the semiconductor switching device according to the ninth aspect of the present invention, the second impedance element comprises a third diode and a variable resistor. The variable resistor is adjusted with considering resistance of each semiconductor switching element or normal divided voltage of each semiconductor switching element to flow adequate compensating current which makes voltage of each semiconductor switching element closer to the equally divided voltage.

In the semiconductor switching device according to the tenth aspect of the present invention, a DC voltage converter is connected to the first capacitor with input terminals thereof and connected to power input terminals of a gate drive circuit with output terminals thereof. Voltage of the first capacitor is regulated by the DC voltage converter and, then, supplied to the gate drive circuit.

In the semiconductor switching device according to the eleventh aspect of the present invention, the second capacitor is connected in parallel to at least one non-linear circuit for supplying gate driving voltage. A DC voltage converter is connected to the second capacitor with input terminals thereof and connected to power input terminals of a gate drive circuit with output terminals thereof. Voltage of the second capacitor is regulated by the DC voltage converter and, then, supplied to the power input terminals of the gate drive circuit.

In the semiconductor switching device according to the twelfth aspect of the present invention, the first capacitor comprises series connected capacitors and each capacitor is connected to the respective non-linear unit in parallel. A DC voltage converter is connected in parallel to one or more capacitors of lower voltage side with input terminals thereof and connected to power input terminals of a gate drive circuit with output terminals thereof. Voltage of said one or more capacitors is regulated by the DC voltage converter and, then, supplied to the power input terminals of the gate drive circuit.

According to the thirteenth aspect of the present invention, the first diode of the above described semiconductor switching device is replaced with a power regeneration switch. For example, the power regeneration switch comprises a diode having the same forward direction as the first diode and a switching element connected in parallel thereto. By turning the switching element on following turn off of the semiconductor element and turning the switching element off before the semiconductor switching element turns on again, energy stored into the first capacitor through the diode of the power regeneration switch is regenerated to the power source through the switching element of the power regeneration switch.

In the semiconductor switching device according to the fourteenth aspect of the present invention, a large Qrr diode, in which reverse recovery charge is 10 percent or more of forwardly flowed charge when the semiconductor switching element turns off, is used as the first diode. By using the large Qrr diode, i.e. diode in which reverse recovery charge is large, charge Qrr as same as charge Qin, which flowed into the first capacitor when the semiconductor switching element turned on, is regenerated to the power source during reverse recovery period thereof.

In the semiconductor switching device according to the fifteenth aspect of the present invention, a diode-on delay device is connected to the first diode in parallel.

In case the semiconductor switching device comprising semiconductor switching elements connected in series and the semiconductor switching elements turns on asynchronously, current flows through the first diode and the first capacitor connected to the semiconductor switching element of still off state toward the semiconductor switching element of on state. Afterward, the semiconductor switching element turns on lately, reverse current occurs in the first diode connected thereto so that the first diode may be broken.

With the diode-on delay device, beginning of conduction at the first diode is delayed so that all the semiconductor switching elements turns on before current starts to flow through the first diode and first capacitor. Thereby, current bypassing the semiconductor switching element of late turn on does not flows so that clue to the reverse current does not happens. Accordingly, safe and reliable semiconductor switching device can be obtained regardless of the asynchronous turn on among the semiconductor switching elements.

DETAILED DESCRIPTION

Figure 1:
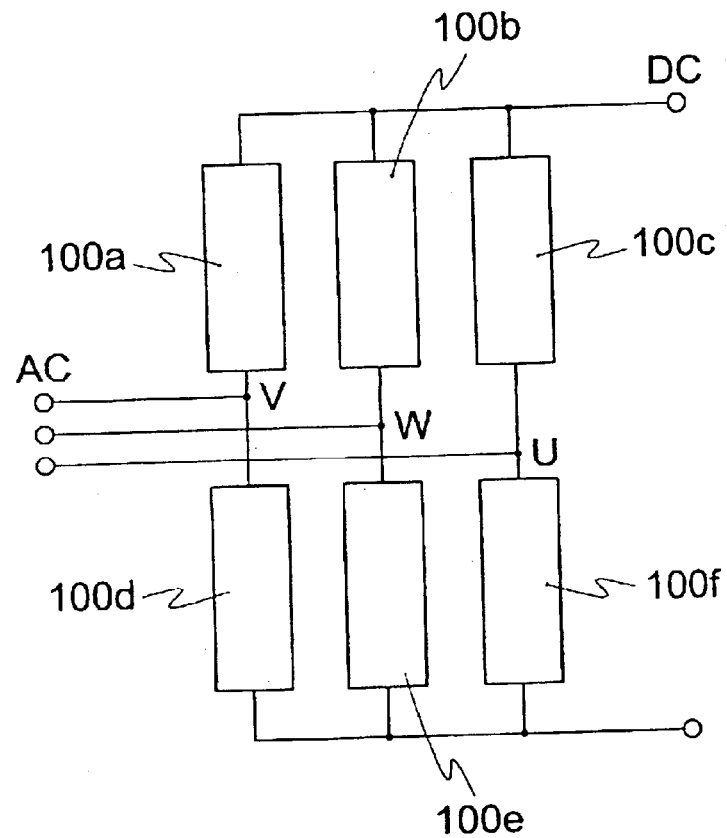
FIG. 1 is a simplified diagram showing an inverter for a power system.

A semiconductor switching device, which is used in a power system for converting AC to DC and vise versa, are shown in a simplified diagram of FIG. 1. In FIG. 1, bridge arms 100(100*a*–100*f*) are shown and each bridge arm comprises semiconductor switching elements connected serially. Hereinafter, each semiconductor switching element in each bridge arm 100*a*–100*f* is called as a series valve.

Figure 2:
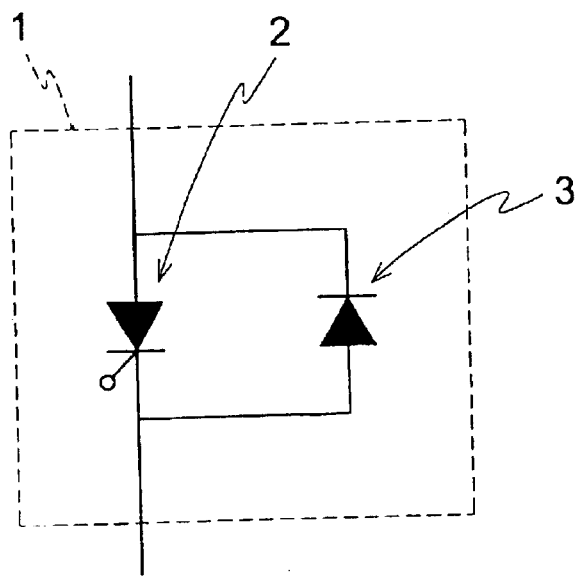
FIG. 2 is a circuit diagram showing a series valve in a semiconductor switching device.

While the series valves are connected serially to form the bridge arm 100*a*–100*f*, only one series valve 1 is shown in FIG. 2. As shown in FIG. 2, a reverse-conducting diode 3 is connected to a semiconductor switching element 2 so that a reverse-conducting switching element is constructed. As the semiconductor switching element 2, a GCT(Gate Commutated Turn-off Thyristor) can be used. Other than the GCT, a semiconductor switching element having self-quenching function such as a GTO, IGBT, SIT, FET, bipolar transistor or the like also can be used.

In case the power is supplied from AC to DC, each bridge arm works as a rectifier in which current flows through the reverse-conducting diode 3 so that the semiconductor switching device works as a three phase rectifier. If higher DC output voltage than supplied AC voltage is required, the GCT of the bridge arm 100*b* is turned on, during a period in which voltage of terminal V is positive to that of terminal W, to form a short circuit through the diode of bridge arm 100*a* and the GCT of bridge arm 100*b*. Electromagnetic energy is stored into inductance of AC side circuit(not shown), and output to the DC side superposed on supplied AC voltage. With such operation, a step-up rectifier is achieved and well known in the art.

In case the power is converted from DC to AC, the series valves in each bridge arm are turned on with a phase shift of 180 degree between series bridge arms and with phase shifts of 120 degree between bridge arms connected to terminals V, W and U, so that three phase alternative current is obtained. Moreover, in some recent semiconductor switching devices, PWM (pulse width modulation) is used to make waveform of output voltage closer to the ideal sign wave to suppress higher harmonics.

These semiconductor switching devices are preferable for DC power transmission system in which power is exchanged in both direction, i.e. AC to DC and DC to AC. In these application, since voltage for each bridge arm is considerably high, for example 10 kV or more, a lot of the series valves shown in FIG. 2 are connected in series to form each bridge arm 100.

Embodiment 1

Figure 3:
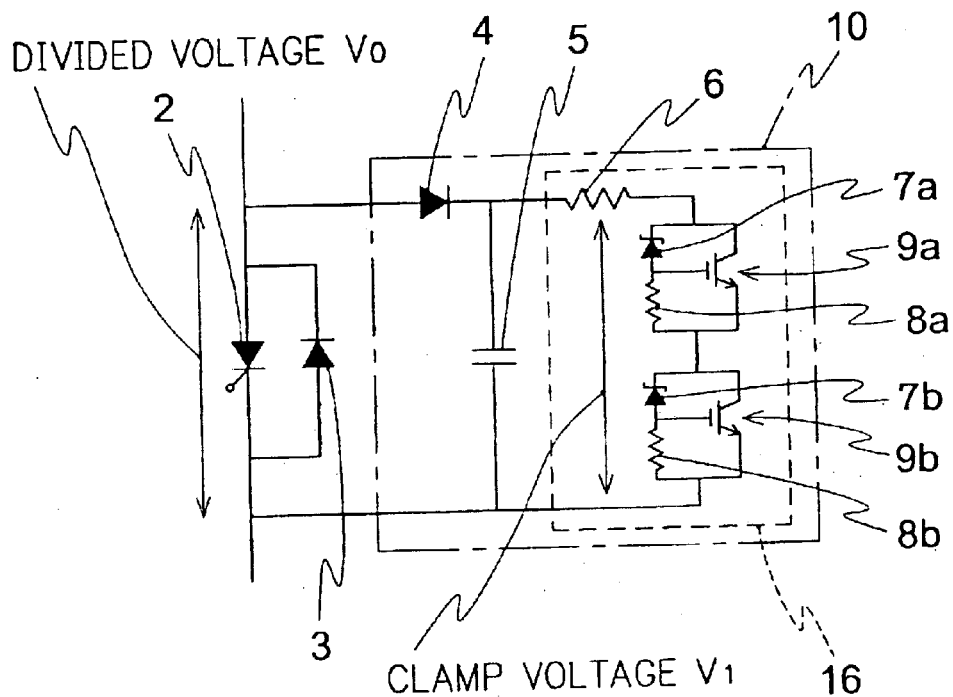
FIG. 3 is a circuit diagram showing Embodiment 1 of the present invention.

Embodiment 1 of the present invention is described with referring to FIG. 3. A unit in a bridge arm of a semiconductor switching device of the present invention, that is, a series valve with an auxiliary circuit thereof, is shown in FIG. 3. In FIG. 3, 10 denotes a snubber circuit, 16 denotes a non-linear circuit, 4 denotes a first diode, 5 denotes a first capacitor, 6 denotes a first impedance element, 7(7*a*, 7*b*) denotes a first Zener diode which is a non-linear resistor element, 8(8*a*, 8*b*) denotes a first resistor, 9(9*a*, 9*b*) denotes a first controlling semiconductor element, $V_1$ denotes a clamp voltage determined by the first Zener diodes 7*a*, 7*b* of the non-linear circuit 16, 2 denotes a semiconductor switching element, 3 denotes a reverse-conducting diode connected parallelly and reversely to the semiconductor switching element 2, and $V_0$ denotes normal divided voltage in which the semiconductor switching element 2 operates. While a IGBT (Insulated Gate Bipolar Transistor) is shown for the first controlling semiconductor element 9*a*, 9*b* in FIG. 3, a conventional bipolar transistor, FET (Field Effect Transistor) or the like can be used.

Assuming that n-type semiconductor elements are used for the first controlling semiconductor element 9*a*, 9*b*, the first Zener diode 7*a*, 7*b* is connected between a main electrode in high voltage side (i.e. drain or collector) and a controlling electrode (i.e. gate or base) of the first controlling semiconductor element 9*a*, 9*b*. Further, the first resistor 8*a*, 8*b* is connected between the controlling electrode (i.e. gate or base)and a main electrode in low voltage side (i.e. source or emitter) of the first controlling semiconductor element 9*a*, 9*b*. The first controlling semiconductor element 9*a*, 9*b* acts as an analog amplifier so that the voltage-current characteristic of the first Zener diode 7*a*, 7*b* is amplified and appears between the two main electrode of the first controlling semiconductor element 9*a*, 9*b*, thereby large discharge current can be drawn.

Moreover, since the first impedance element 6 is connected to the first Zener diode 7*a*, 7*b* and the first controlling semiconductor element 9a, 9b respectively in series, the clamp voltage $V_1$ at which said discharge begins and the relation between voltage and discharge current can be freely determined. Furthermore, when a voltage applied to the first Zener diode 7a, 7b is smaller than the Zener voltage thereof, no discharge current is drawn. Therefore, the first capacitor 5 never discharges below the Zener voltage, so that lowering of efficiency caused by useless charge and discharge is prevented.

Operation of the semiconductor switching device according to the present Embodiment is described with referring to FIG. 3.

In normal operating conditions, voltage applied to the semiconductor switching device is divided among the semiconductor switching elements 2 connected in series and each semiconductor switching element 2 is charged with the normal divided voltage $V_0$. In other word, assuming that the number of the series connected semiconductor switching elements 2 is "n" and the voltage applied to the semiconductor switching device is "E", the normal divided voltage $V_0$ is represented by "E/n". Moreover, any of the semiconductor switching elements 2 is troubled, the normal divided voltage $V_0$ is represented by "E/(n−1)".

By maintaining voltage of the first capacitor 5 higher than this normal divided voltage $V_0$, it becomes possible to suppress current from power source flowing into the first diode 4 and the first capacitor 5, when a surge is caused by turn off of the semiconductor switching element 2. In this case, the energy of surge is temporary absorbed into the first capacitor 5 so that voltage of the first capacitor 5 is raised, and thereafter, discharges to the clamp voltage $V_1$.

In case an accident, such as a short circuit in electric facilities, happens at the supplying side (outputting side) of the semiconductor switching device, voltage of power source varies so that the divided voltage for each semiconductor switching element 2 becomes higher than the normal divided voltage $V_0$.

If the clamp voltage $V_1$ is smaller than this higher divided voltage, current continuously flows into the non-linear circuit 16 thereby destruction of the non-linear circuit 16 may be caused. In the present embodiment, therefore, the clamp voltage $V_1$ is set to be higher than the divided voltage under the accident to prevent the destruction of the non-linear circuit 16.

As described above, since the clamp voltage $V_1$ is higher than the divided voltage of the semiconductor switching element 2, current flowing into the non-linear circuit 16 is controlled and never continues even if there is an accident at the supplying side. Thereby, the destruction of the non-linear circuit 16 is prevented and the semiconductor switching device operates safely.

However, if surplus of the clamp voltage $V_1$ to the divided voltage under the accident is too large, it becomes hard to divide the voltage equally among the semiconductor switching elements 2. Therefore, it is preferable to minimize the surplus of the clump voltage $V_1$. The surplus of the clamp voltage $V_1$ to the divided voltage under the accident is determined based on a forecast of the divided voltage under the accident and accuracy thereof, and typically 1 to 10 percent.

According to the present embodiment, minimum necessity voltage can be kept for the clamp voltage $V_1$, and, at the same time, the clamp voltage $V_1$ does not become too high. Therefore, the components of the semiconductor device are protected from excess voltage, and the components of lower withstand voltage can be safely used.

Embodiment 2

Figure 4:
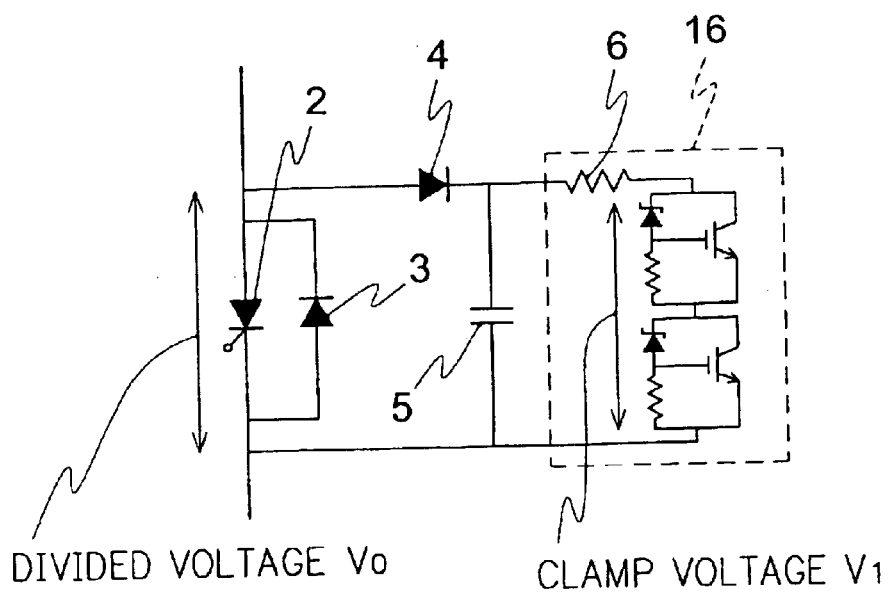
FIG. 4 is a circuit diagram showing Embodiment 2 of the present invention.

Embodiment 2 of the present invention is described with referring to FIG. 4. As described above, an accident, such as a short circuit in electric facilities, happens at the supplying side of the semiconductor switching device, voltage of power source rises. As the result of our researches and experiments for various power sources, we have found that the voltage, under the accident, rises to about 1.27 times as high as that without accident at the maximum. Therefore, the clamp voltage $V_1$ is set to be about 1.3 times or higher to the normal divided voltage $V_0$.

With the clamp voltage $V_1$ about 1.3 times or larger to the normal divided voltage $V_0$, the non-linear circuit 16 is protected from the destruction even the accident happens at the supplying side. Moreover, the clamp voltage $V_1$ can be set to its minimum necessity voltage. In case the clamp voltage $V_1$ is set to about 1.3 times as high as the normal divided voltage $V_0$, the clamp voltage $V_1$ is minimized so that breakdown of the components and increase in cost for the first capacitor 5 are prevented. In case the clamp voltage $V_1$ is extremely high, for example two or five times as high as the normal divided voltage $V_0$, voltage of the first capacitor 5 also becomes two or five times as high as the normal divided voltage $V_0$ so that the semiconductor switching element 2 and the first diode 4, which are connected to the first capacitor 5, and the first capacitor 5 itself may be broken. Therefore, attention should be paid to withstand voltage of the components, in case the clamp voltage $V_1$ is larger than 1.3 times of the normal divided voltage.

Embodiment 3

Figure 5:
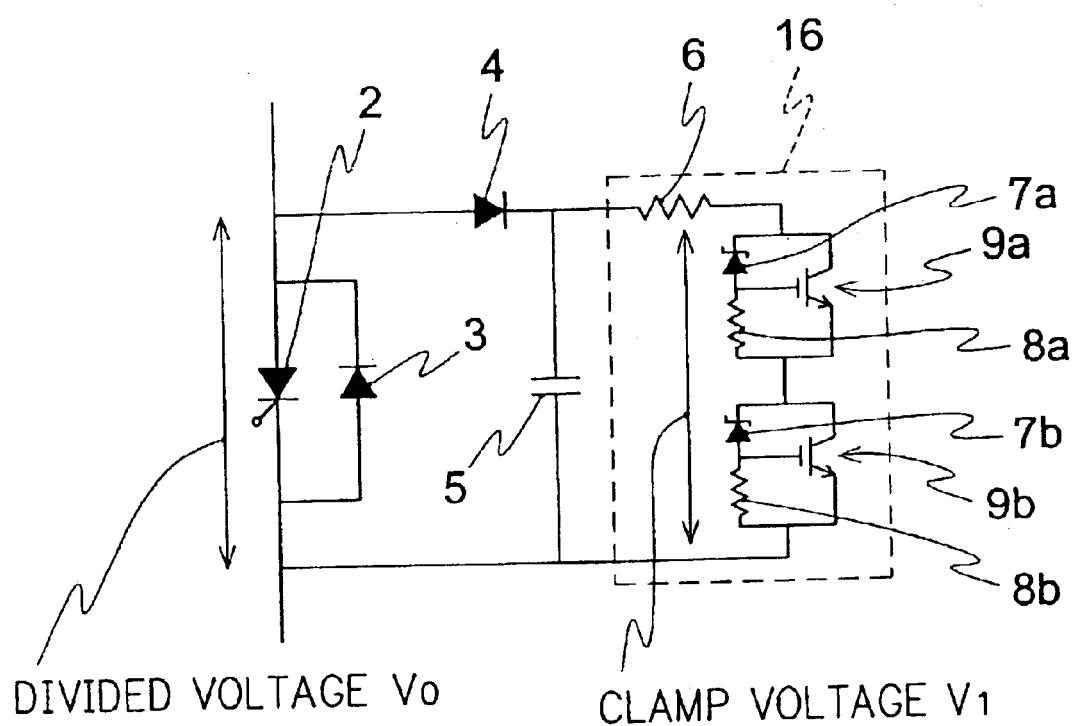
FIG. 5 is a circuit diagram showing Embodiment 3 of the present invention.

Embodiment 3 of the present invention is described with referring to FIG. 5. As described above, the divided voltage of the semiconductor switching element 2 is higher than the normal divided voltage $V_0$ when the accident happens. As the divided voltage exceeds the clamp voltage $V_1$, current flows through the non-linear circuit 16 and loss, which depends on the current and the clump voltage $V_1$, is caused at the first controlling semiconductor element 9a, 9b. If the loss exceeds the capacity of the first controlling semiconductor element 9a, 9b thermally, the first controlling semiconductor element 9a, 9b is broken. To protect the first controlling semiconductor element 9a, 9b, impedance of the first impedance element 6 is increased in the present Embodiment so that current flowing through the non-linear circuit 16 is decreased, and thereby, the loss at the first controlling semiconductor element 9a, 9b is suppressed below the capacity thereof. At this time, impedance of the first impedance element 6 satisfies following equations.

("loss at the first controlling semiconductor element 9a, 9b") =

(("divided voltage") − ("clamp voltage $V_1$"))/

("impedance of the first impedance element 6") ∗

("clamp voltage $V_1$")

("loss at the first controlling semiconductor element 9a, 9b")≦("capacity of the first controlling semiconductor element 9a, 9b")

As described in above Embodiment 2, the clamp voltage $V_1$ as same as or larger than 1.3 times of the normal divided voltage $V_0$ is preferable. In the present Embodiment, the loss at the first controlling semiconductor element is decreased by increasing the impedance of the first impedance element 6. A number of the first controlling semiconductor elements connected in series or parallel can be increased to enhance the capacity of the first controlling semiconductor elements as a whole. With the above arrangements, the following equation is satisfied and a semiconductor switching device, in which destruction of the non-linear circuit 16 is prevented even if an accident happens at supplying side of the device, can be obtained.

("loss at the first controlling semiconductor element 9a, 9b")<("capacity of the first controlling semiconductor element 9a, 9b")

Meanwhile, an IGBT is employed as the first controlling semiconductor element 9(9a, 9b) in the Embodiment shown in FIG. 5, a FET or another conventional transistor is also applicable. In case a FET is used as the first controlling semiconductor element 9, anode and cathode of the first Zener diode 7(7a, 7b) are connected to gate and drain of the FET respectively, and first resistor 8(8a, 8b) is connected between gate and source of the FET.

Embodiment 4

Figure 6A:
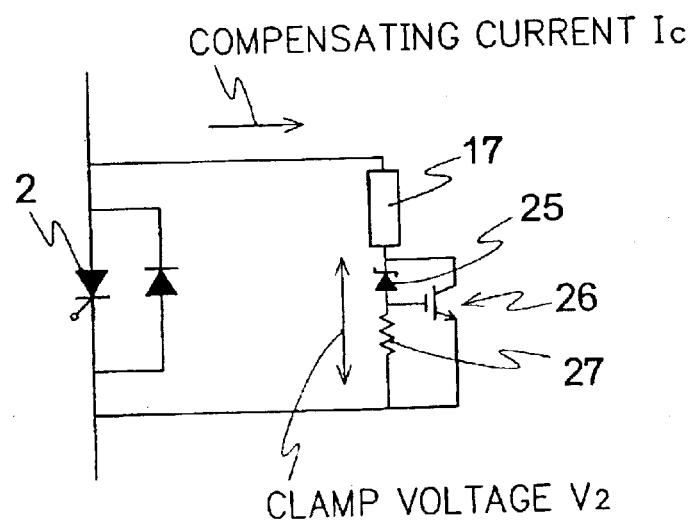
FIGS. 6(a) and 6(b) are circuit diagrams showing Embodiment 4 of the present invention.

Embodiment 4 of the present invention is described with referring to FIG. 6(a). Since the snubber circuit 10 of the above Embodiments operates only while the divided voltage of the switching elements 2 exceeds the clamp voltage $V_1$, unevenness in the divided voltage among the switching elements, which depends on uneven leakage currents of the switching elements, almost remains. In the present Embodiment, compensating current, which, begins to flow at the second clamp voltage smaller than the normal divided voltage $V_0$, is introduced to reduce this unevenness. With this compensating current, unevenness in the divided voltage is reduced without causing large loss.

Figure 25:
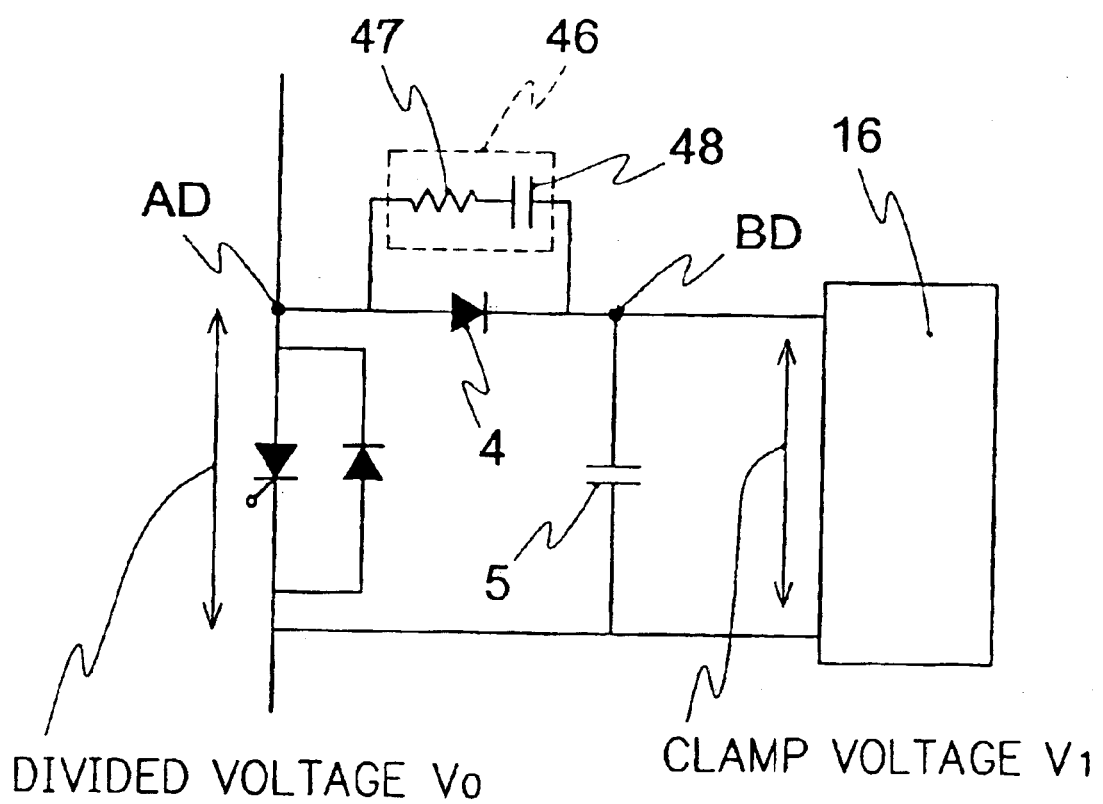
FIG. 25 is a circuit diagram showing Embodiment 17 of the present invention.
Figure 26:
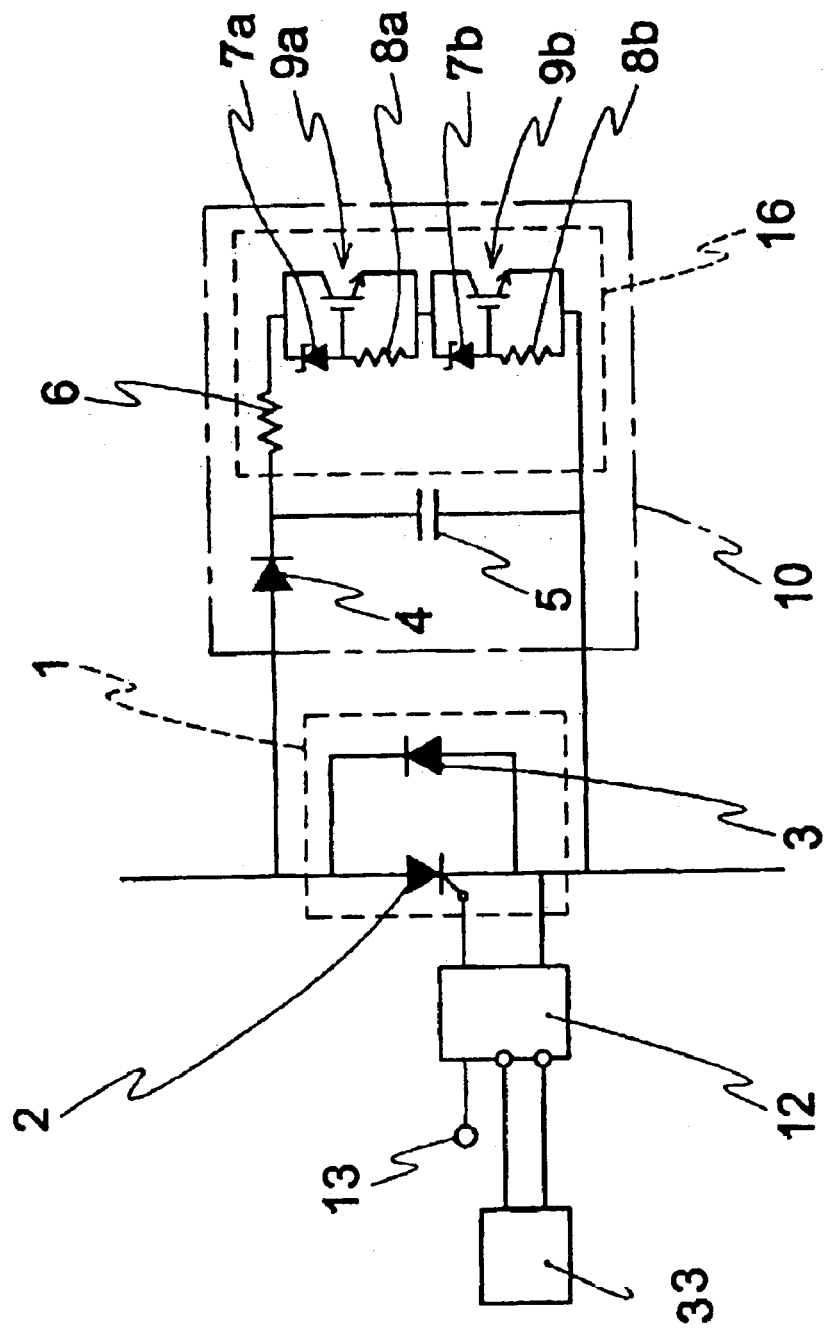
FIG. 26 is a circuit diagram showing a prior art semiconductor switching device.

In FIG. 6(a), 25 denotes a second Zener diode, 27 denotes a second resistor connected to anode of the second Zener diode 25, 26 denotes a second controlling semiconductor element, 17 denotes a second impedance element connected to higher voltage side of the semiconductor switching element 2 to control the compensating current, $V_2$ denotes a second clamp voltage determined by Zener voltage of the Zener diode 25, and Ic denotes the compensating current to equalize the divided voltages among the semiconductor switching elements 2.

Operation of the semiconductor switching device according to the present Embodiment is described with referring to FIG. 6(a). In case the semiconductor switching elements 2, such as GTO (Gate Turn-Off Thyristor) or GCT, are connected in series, leakage currents at their Off-state are different for each semiconductor switching element, therefore, the divided voltage of each semiconductor switching element 2 are uneven. In other word, within a bridge arm in Off-state, divided voltage of a semiconductor switching element is higher than that of the other semiconductor switching elements. When the highest divided voltage rises to exceed the second clamp voltage $V_2$, Zener current flows through the second Zener diode 25 to draw the compensating current Ic through the second controlling semiconductor element 26, thereby, the highest divided voltage is suppressed to the divided voltage of the other semiconductor switching elements.

Figure 6B:
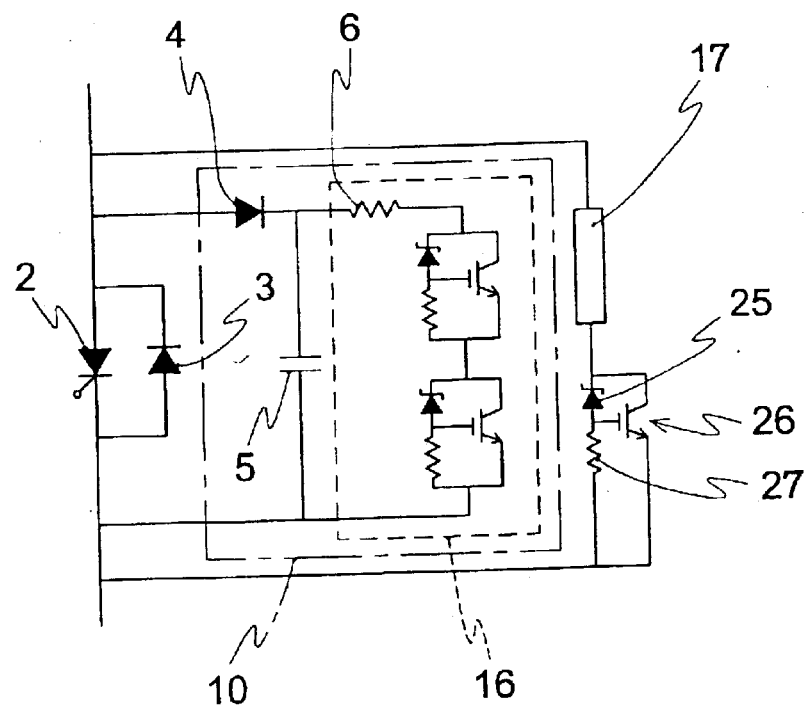

As shown in FIG. 6(b), the above compensation circuit is preferably used together with the snubber circuit 10. Moreover, a FET or the like can be used as the second controlling semiconductor element 26, and in such case, anode and cathode of the second Zener diode 25 are connected to gate and drain of the FET respectively, and second resistor 27 is connected between gate and source of the TFT.

Embodiment 5

Figure 7:
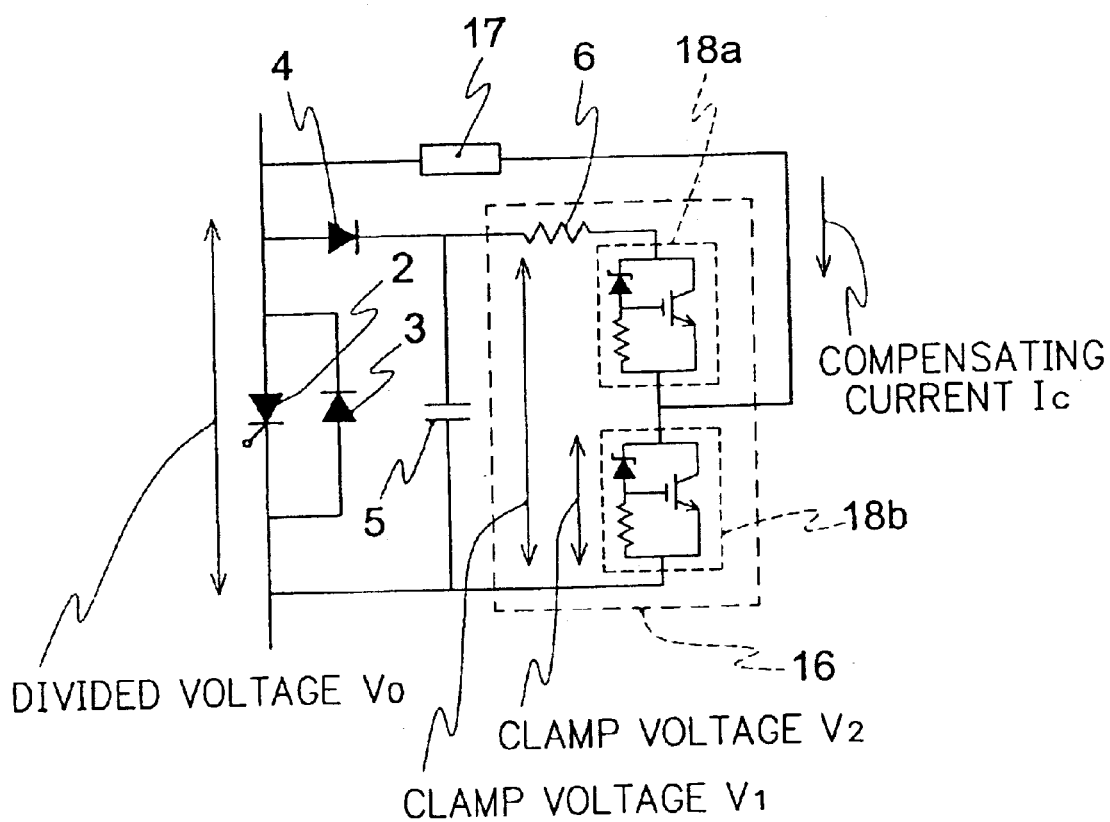
FIG. 7 is a circuit diagram showing Embodiment 5 of the present invention.

Embodiment 5 of the present invention is described with referring to FIG. 7. In a semiconductor switching device according to Embodiment 5, the non-linear circuit 16 comprises at least two non-linear units 18(18a, 18b) coupled in series and the second impedance element 17 is connected to the coupling point thereof. In other words, the non-linear unit 18b is utilized for providing the second clamp voltage. $V_2$ in the present Embodiment.

Operation of the semiconductor switching device according to the present Embodiment is described with referring to FIG. 7. In the semiconductor switching elements 2 connected in series, leakage currents at their Off-state are different for each semiconductor switching element, therefore, the divided voltage of each semiconductor switching element 2 are not equal. However, in the semiconductor switching element 2 in which divided voltage higher than the clamp voltage $V_2$ appears, the non-linear unit 18b turns on to draw a compensating current Ic from high voltage side of the semiconductor switching element 2 to lower voltage side of the same through the second impedance element 17 and the non-linear unit 18b so that the divided voltage for the semiconductor switching element 2 is lowered. Thereby, the divided voltage for each semiconductor switching element is almost equalized.

Moreover, in the semiconductor switching element 2 at its transition such as turn on or turn off, the snubber circuit 10 suitably operates to absorb overvoltage applied to the semiconductor switching element 2 into the first capacitor 5, and if voltage of the first capacitor 5 exceeds the clamp voltage $V_1$, the excess voltage is discharged through the non-linear circuit 16.

Embodiment 6

Figure 8:
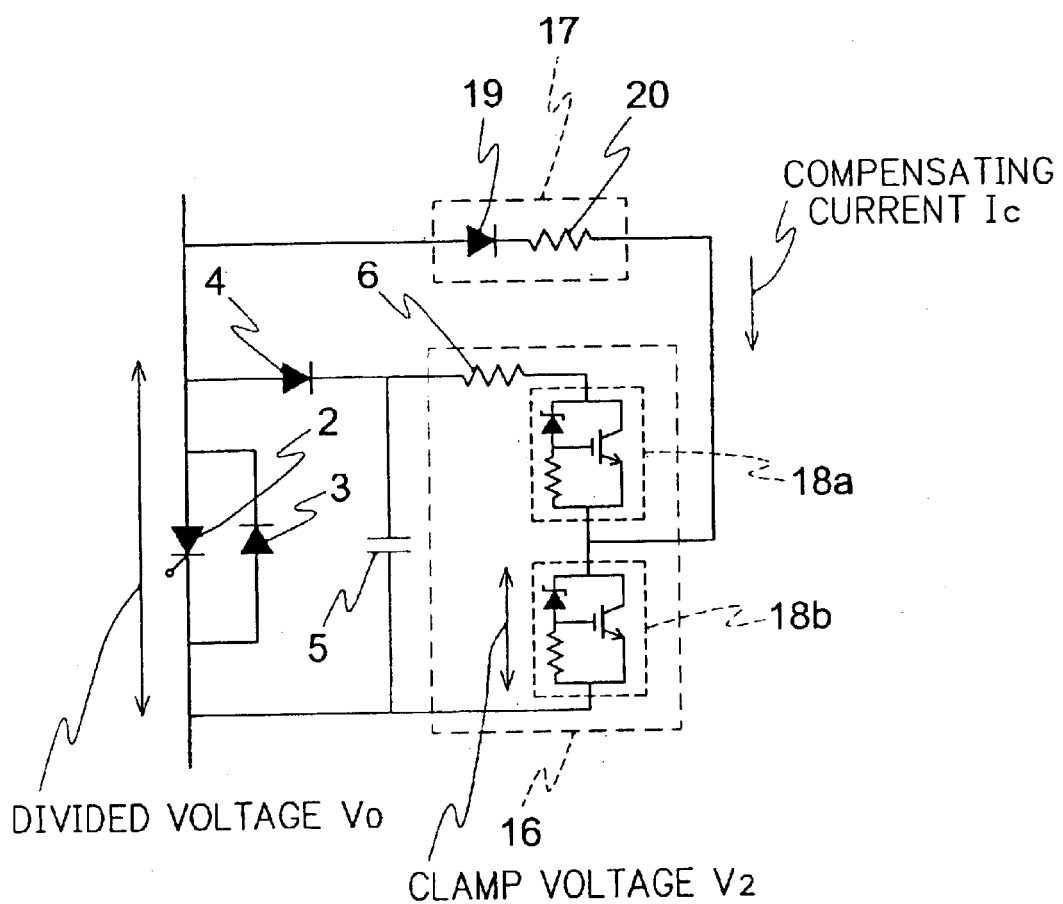
FIG. 8 is a circuit diagram showing Embodiment 6 of the present invention.

Embodiment 6 of the present invention is described with referring to FIG. 8. In FIG. 8, 19 denotes the third diode and 20 denotes the third resistor. The second impedance element 17 comprises the third diode 19 and the third resistor 20 connected in series, and the compensating current Ic flows through them.

Operation of the semiconductor switching device according to the present Embodiment is described with referring to FIG. 8. In the semiconductor switching elements 2 connected in series, leakage currents at their Off-state are different for each semiconductor switching element, therefore, the divided voltage of each semiconductor switching element 2 are uneven. However, in the semiconductor switching element 2 in which divided voltage higher than the clamp voltage $V_2$ appears, the non-linear unit 18b turns on to draw a compensating current Ic through the third diode 19 and the third resistor 20 so that the divided voltage for each semiconductor switching element is equalized. In the present Embodiment of FIG. 8, discharge from the first capacitor 5 is prevented by the third capacitor 19, and the compensating current Ic is regulated by the third impedance 20.

Embodiment 7

Figure 9A:
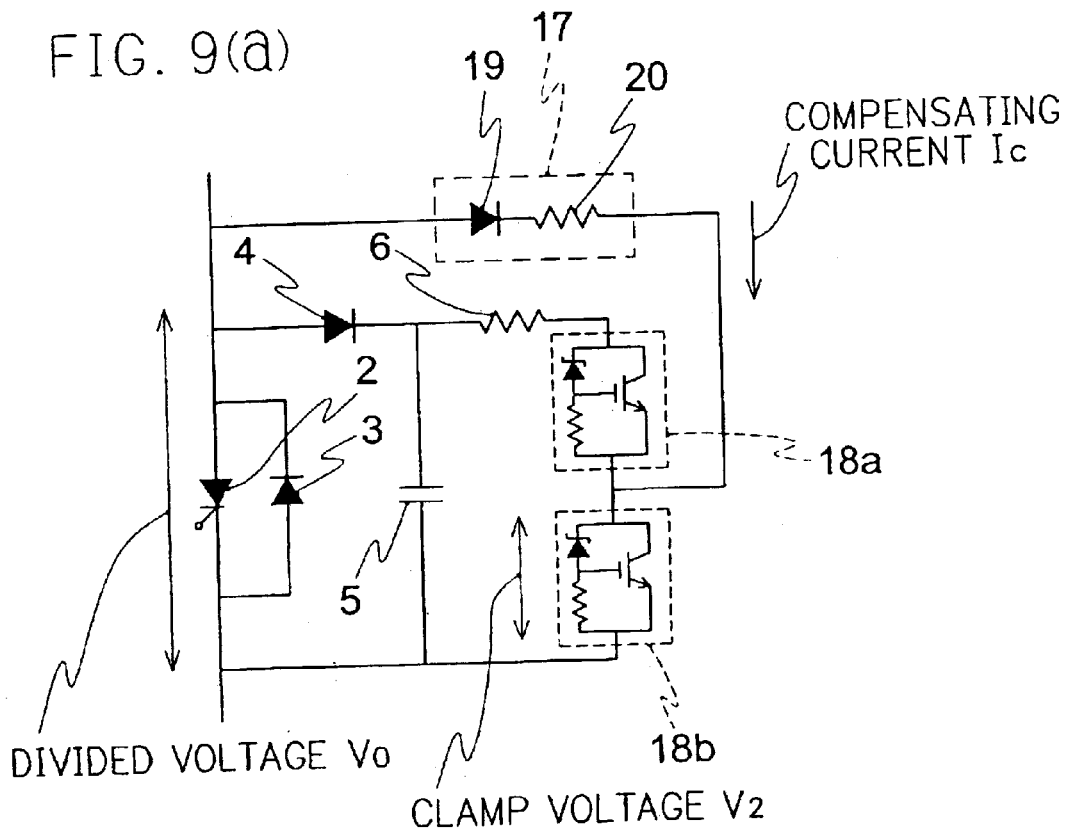
FIG. 9(*a*) is a circuit diagram showing Embodiment 7 of the present invention, and FIG. 9(*b*) is a graph showing relation between compensating current and voltage applied to the semiconductor switching element.

Embodiment 7 of the present invention is described with referring to FIG. 9(a). As shown in FIG. 9(a), the second impedance element 17, comprising the third diode 19 and the third resistor 20 connected in series, is connected between the high voltage side of the semiconductor switching element 2 and the coupling point of the non-linear units 18a, 18b. Moreover, the second clamp voltage $V_2$ of the non-linear unit 18b is set to be lower than the normal divided voltage $V_0$, so that the second impedance element 17 begins its operation at the voltage below the normal divided voltage $V_0$.

Figure 9B:
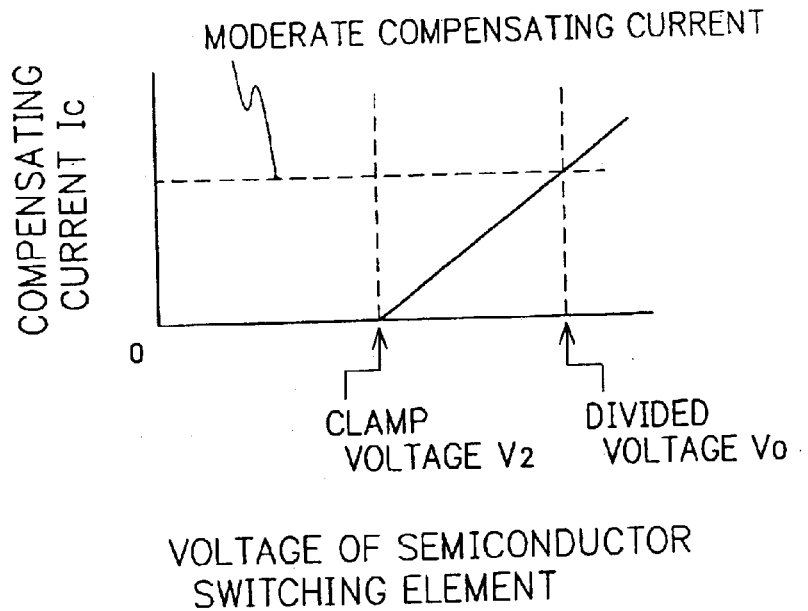

Operation of the semiconductor switching device according to the present Embodiment is described with referring to FIG. 9(a), 9(b). As described above, in the semiconductor switching elements 2 connected in series, leakage currents at their Off-state are different for each semiconductor switching element, therefore, the divided voltage of each semiconductor switching element 2 are uneven. If divided voltage of a semiconductor switching element 2 is the largest among the others and reaches to the second clamp voltage $V_2$, the non-linear unit 18b connected thereto turns on so that the compensating current Ic flows through the third diode 19, the third resistor 20 and the non-linear unit 18b to the lower voltage side of the semiconductor switching element 2. Succeedingly, divided voltage of another semiconductor switching element reaches to the second clamp voltage $V_2$ and compensating current Ic begins to flow. If compensating currents Ic are moderate when voltage divided among the semiconductor switching elements approaches to the normal divided voltage $V_0$, i.e. if the second clamp voltage is chosen to flow the moderate compensating currents by difference between the normal divided voltage $V_0$ and the second clamp voltage $V_2$, divided voltage of each semiconductor switching element is equalized to the normal divided voltage $V_0$. The moderate compensating current is determined considering acceptable levels of unevenness and losses caused by the current.

Embodiment 8

Figure 10:
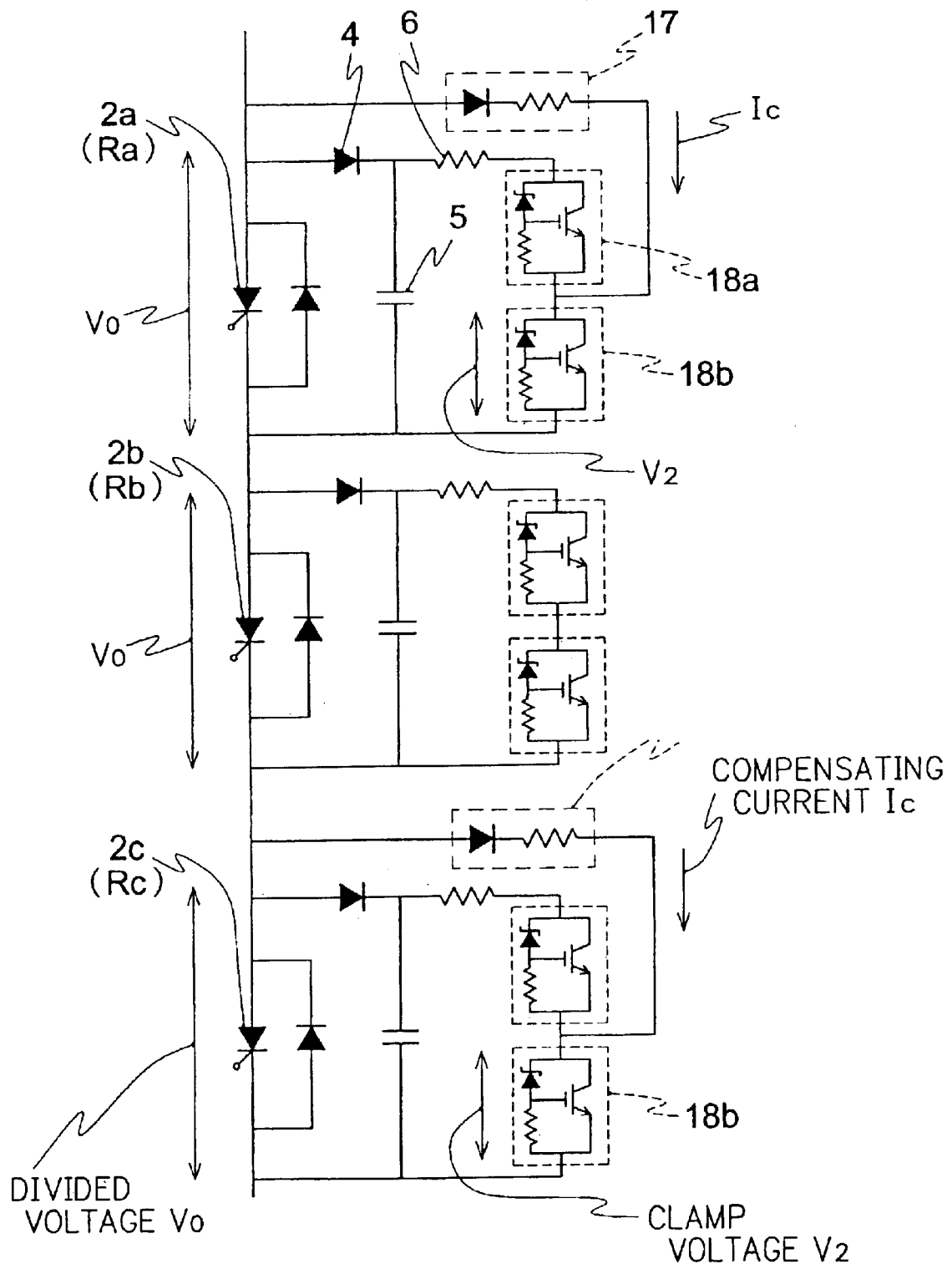
FIG. 10 is a circuit diagram showing Embodiment 8 of the present invention.

Embodiment 8 of the present invention is described with referring to FIGS. 10. 2a, 2b and 2c denote a semiconductor switching element respectively, 17 denotes the second impedance element 17, 18a and 18b denote a non-linear unit respectively, in FIG. 10. Moreover, resistance of the semiconductor switching elements 2a, 2b and 2c in their Off-state are calculated based on their leakage current, and represented by Ra, Rb and Rc respectively in FIG. 10. In FIG. 10, furthermore, $V_0$ denotes normal divided voltage, $V_2$ denotes the second clamp voltage, and Ic denotes compensating current. As shown in FIG. 10, for the semiconductor switching element 2b in which resistance thereof is the smallest, i.e. Ra>Rb and Rc>Rb, the second impedance element 17 is not provided.

In the semiconductor switching elements connected in series and at their Off-state, divided voltage for the semiconductor switching element 2b, wherein resistance Rb thereof is the smallest, is naturally smallest and smaller than the normal divided voltage $V_0$ divided equally among the semiconductor switching elements. Therefore, the second impedance element 17 to draw compensating current is unnecessary for the semiconductor switching element 2b. For the other semiconductor switching elements, divided voltage are higher than the second clamp voltage $V_2$ so that the compensating current Ic are drawn to regulate the divided voltage.

Embodiment 9

Figure 11:
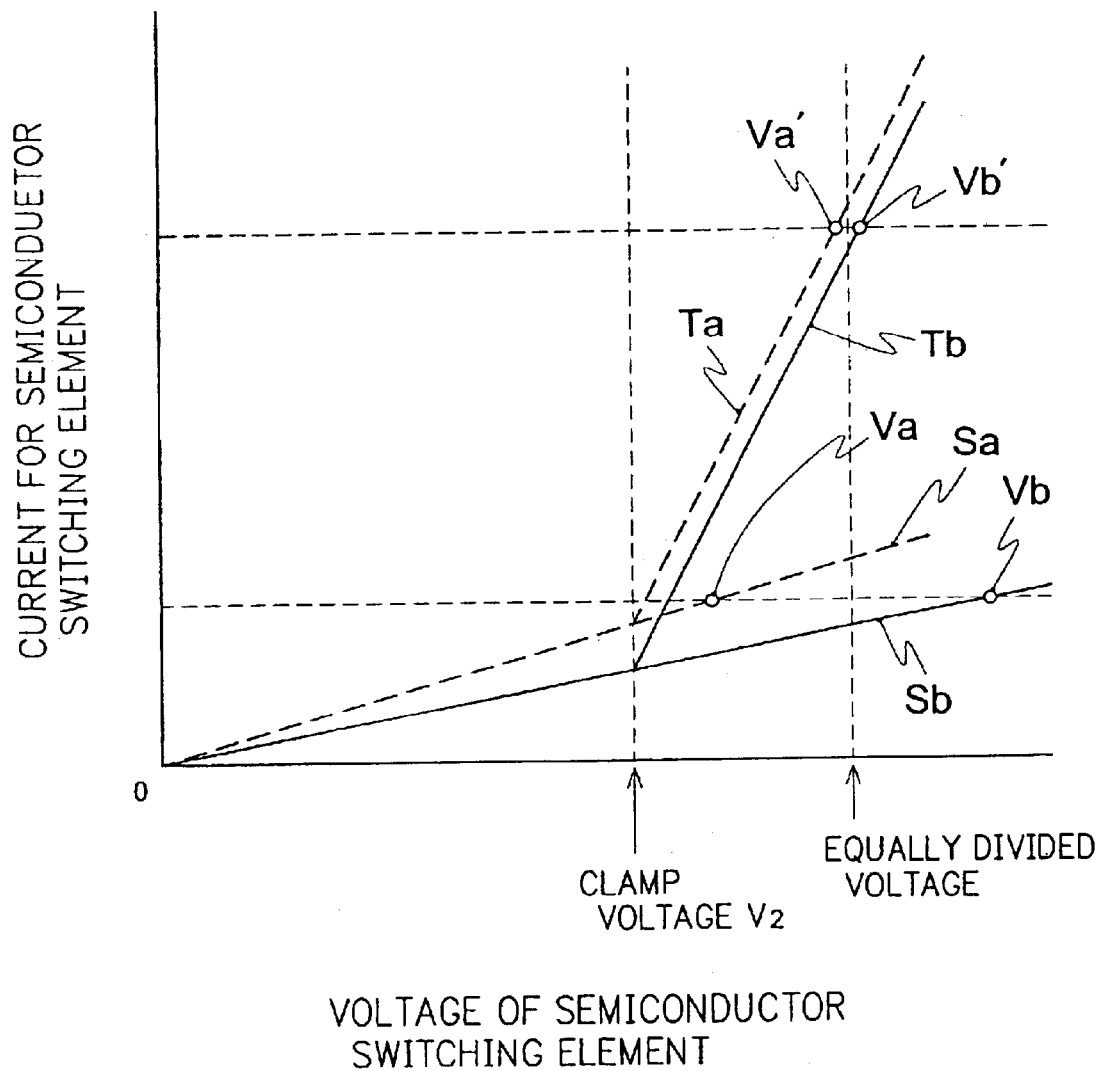
FIG. 11 is a graph showing equalizaition among divided voltage of the semiconductor switching elements.
Figure 12:
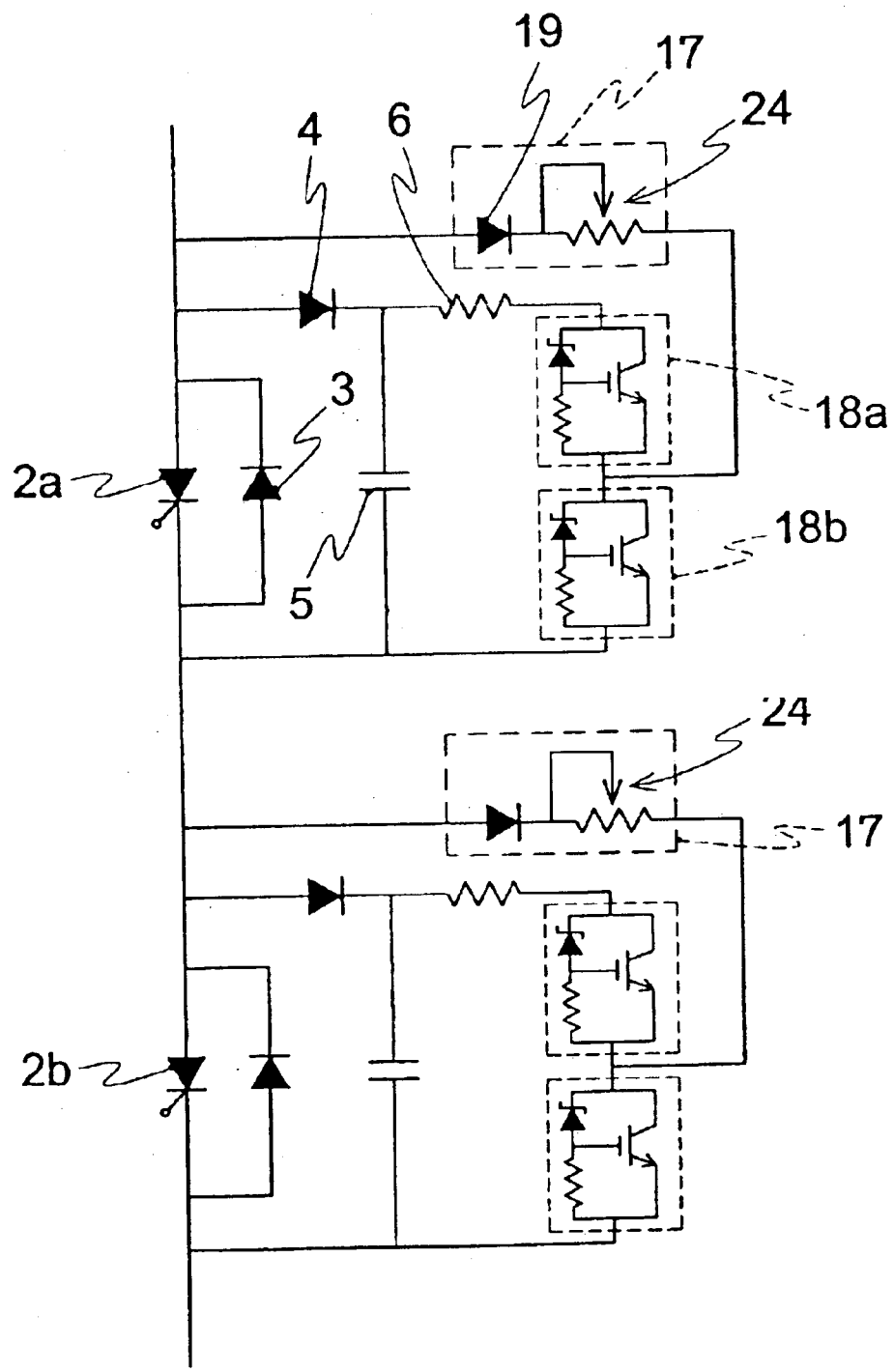
FIG. 12 is a circuit diagram showing Embodiment 9 of the present invention.

Embodiment 9 of the present invention is described with referring to FIGS. 11 and 12. In FIG. 11, for each semiconductor switching element 2a, 2b connected in series and in their Off-state, relation between voltage applied thereto and currents, i.e. leakage current therethrough and compensating current therefor, are shown. In FIG. 11, equally divided voltage in which voltage is ideally divided between two semiconductor elements, and the second clamp voltage in which compensating current Ic begins to flow are indicated.

As shown in broken line Sa for the semiconductor element 2a and solid line Sb for the semiconductor element 2b, in case the second impedance element 17 is not provided, the semiconductor element 2a, 2b are charged with voltage Va and Vb respectively because leakage currents flowing through them are equal. As is apparent from FIG. 11, divided voltage Va and Vb without the second impedance element 17 are varied considerably from the equally divided voltage, that is, uneven.

Meanwhile, in case the second impedance element 17 is provided and voltage applied to each semiconductor switching element 2a, 2b exceeds the second clamp voltage $V_2$, larger current as shown in broken line Ta for the semiconductor element 2a and solid line Tb for the semiconductor element 2b is drawn so that the semiconductor element 2a, 2b are charged with voltage Va' and Vb' respectively. Owing to the larger gradients of lines Ta and Tb, the divided voltage Va' and Vb' are closed to the equally divided voltage and difference between the divided voltage Va' and Vb' is minimized. As described above, the divided voltage are equalized by the clamp voltage $V_2$ and the compensating current Ic.

In FIG. 12, a circuit to obtain more equalized divided voltage Va' and Vb' is shown. In FIG. 12, 24 denotes a variable resistor for adjusting impedance of the second impedance element 17.

The current for each semiconductor switching element 2a, 2b at their Off-state, that is, the gradient of line Ta, Tb shown in FIG. 11, depends on impedance of the second impedance element 17. Therefore, by adjusting the variable resistor 24 of the semiconductor switching element 2a larger to make the gradient of broken line Ta smaller, and by adjusting the variable resistor 24 of the semiconductor switching element 2b smaller to make the gradient of solid line Tb larger, divided voltage Va' and Vb' become more closer so that equalization of divided voltage is achieved.

Embodiment 10

Figure 13:
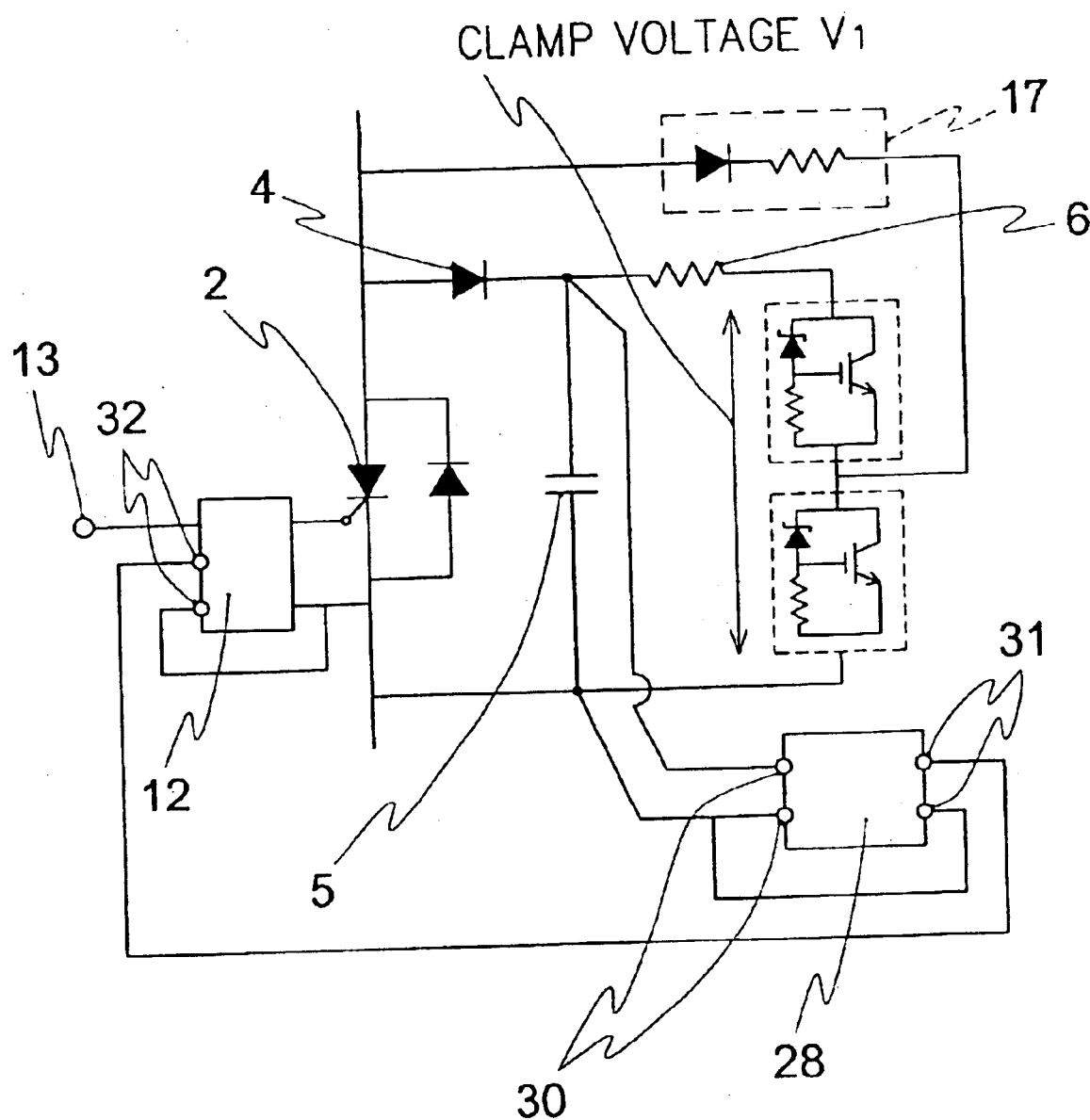
FIG. 13 is a circuit diagram showing Embodiment 10 of the present invention.

Embodiment 10 of the present invention is described with referring to FIG. 13. In FIG. 13, 12 denotes a gate drive circuit to control the semiconductor switching element 2, 13 denotes an input signal to drive the semiconductor switching element 2 provided through an optical fiber or the like, 28 denotes a DC voltage converter, 30 and 31 denote input and output terminals of the DC voltage converter 28 respectively, and 32 denotes power input terminals of the gate drive circuit 12.

In the semiconductor switching device in operation, the first capacitor 5 is charged to the clamp voltage $V_1$. The DC voltage converter 28 is fed with this charged voltage and outputs a regulated voltage on the output terminals 31 thereof. The output terminals 31 are connected to the power input terminals 32 of the gate drive circuit 12, therefore, the regulated voltage is supplied to the gate drive circuit 12 as a power source.

Embodiment 11

Figure 14:
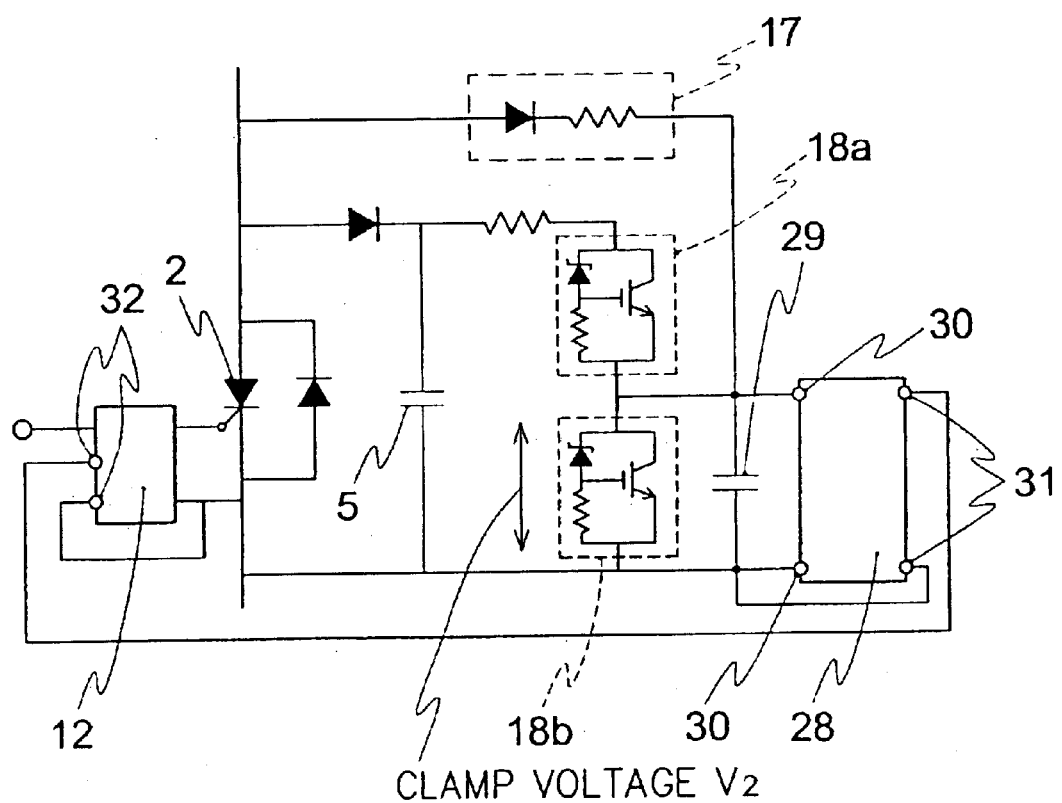
FIG. 14 is a circuit diagram showing Embodiment 11 of the present invention.

Embodiment 11 of the present invention is described with referring to FIG. 14. As shown in FIG. 14, the second capacitor 29 is connected to the non-linear unit 18b in parallel to store the voltage applied to the non-linear circuit 18b. The input terminals 30 of the DC voltage converter are connected between both ends of the second capacitor 29 and the output terminals 31 thereof are connected to the power input terminals 32 of the gate drive circuit 12.

Current toward the non-linear circuit 18b is stored into the second capacitor 29, and the charged second capacitor works as a DC power source having voltage as same as the second clamp voltage $V_2$ of the non-linear unit 18b. The voltage is supplied to the input terminals 30 of the DC voltage converter 28 and regulated voltage appears on the output terminals 31 thereof. The output terminals 31 are connected to the power input terminals 32 of the gate drive circuit 12, therefore, the regulated voltage is supplied to the gate drive circuit 12 as a power source. Compared with the above Embodiment 10 in which the DC voltage converter 28 is connected to the first capacitor 5, voltage applied to the DC voltage converter 28, that is, the voltage of the second capacitor 29, is lower in the present Embodiment so that components having lower withstand voltage are applicable.

Embodiment 12

Figure 15:
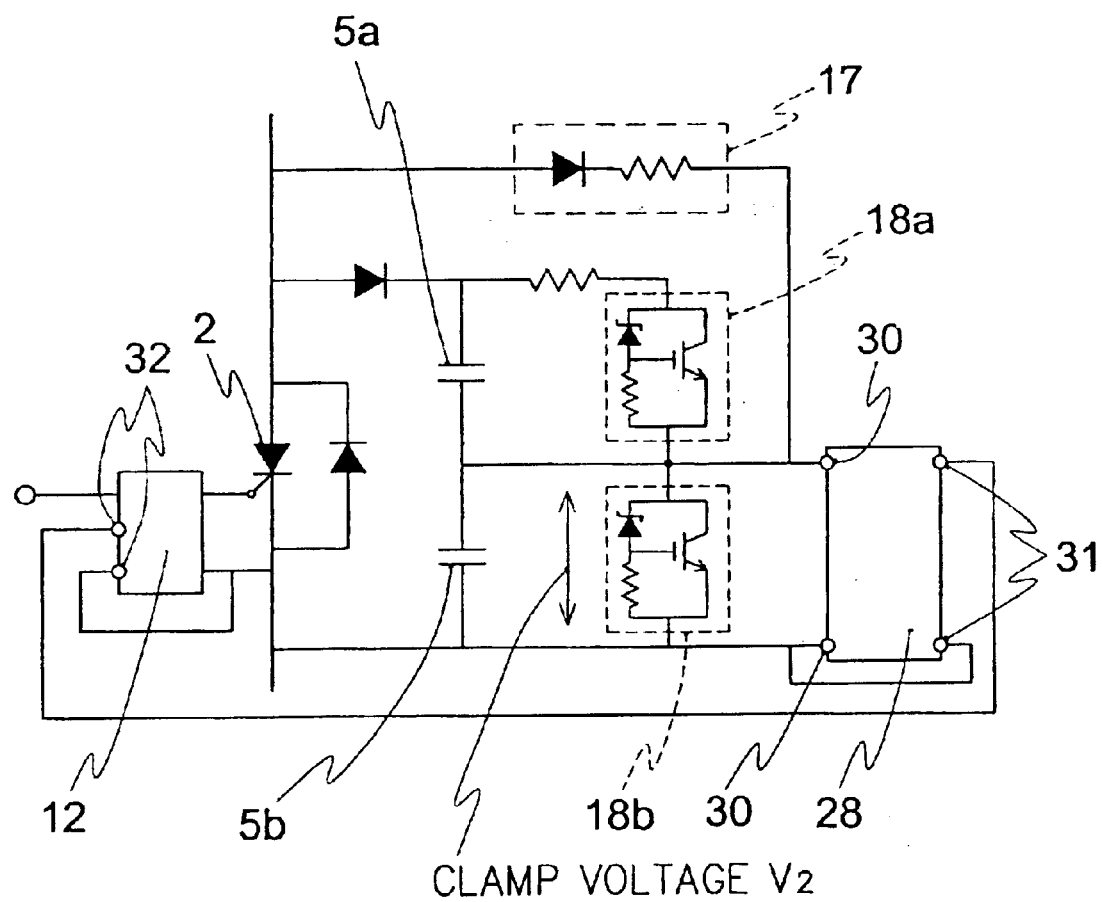
FIG. 15 is a circuit diagram showing Embodiment 12 of the present invention.

Embodiment 12 of the present invention is described with referring to FIG. 15. As shown in FIG. 15, the first capacitor 5 comprises two capacitors 5a, 5b, and the capacitor 5a, 5b are arranged in parallel with the non-linear units 18a, 18b respectively. Moreover, the input terminals 30 of the DC voltage converter 28 are connected between both ends of the second capacitor 5b, that is, both ends of the non-linear unit 18b and the output terminals 31 thereof are connected to the power input terminals 32 of the gate drive circuit 12.

In the semiconductor switching device in operation, the capacitor 5b is charged to the second clamp voltage $V_2$ determined by the non-linear unit 18b. The capacitor 5b is utilized as a DC power source for supplying the DC voltage converter 28. The DC voltage converter 28 regulates the supplied voltage and provides the regulated voltage to the gate drive circuit 12.

Embodiment 13

Figure 16:
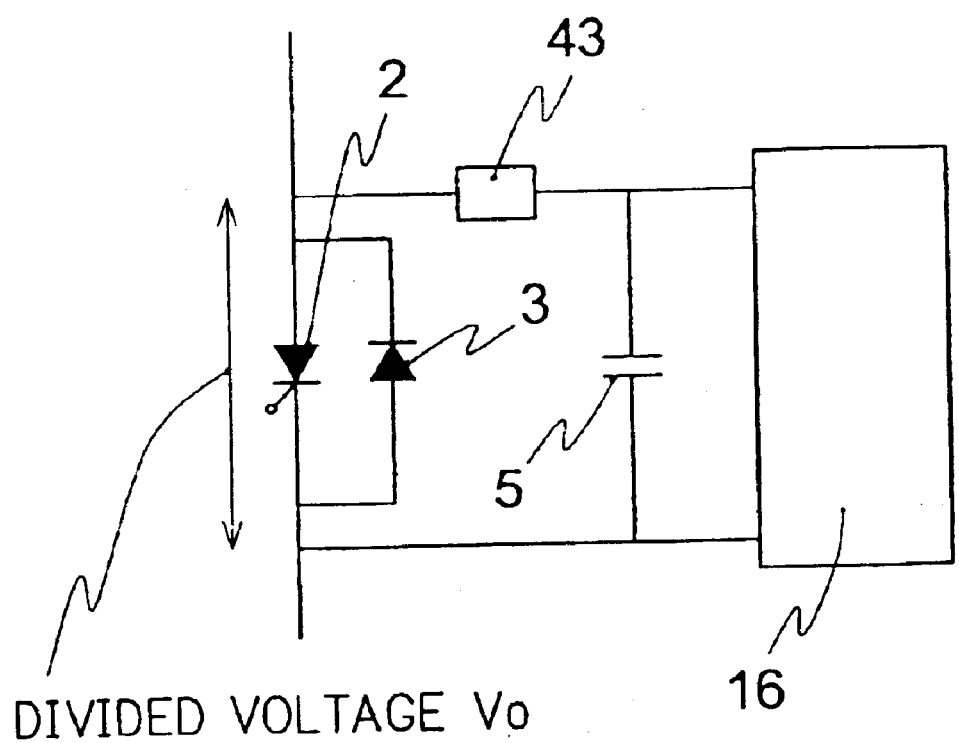
FIG. 16 is a circuit diagram showing Embodiment 13 of the present invention.

Embodiment 13 of the present invention is described with referring to FIG. 16. In FIG. 16, 2 denotes a semiconductor switching element, 3 denotes a reverse-conducting diode, 43 denotes a power regeneration switch, 5 denotes a first capacitor, and 16 denotes a non-linear circuit 16. As shown in FIG. 16, the reverse-conducting diode is connected to the semiconductor switching element in parallel, the power regeneration switch 43 and the first capacitor 5 are connected in series and connected in parallel to the semiconductor switching element 2, and the non-linear circuit 16 is connected in parallel with the first capacitor 5.

Figure 17:
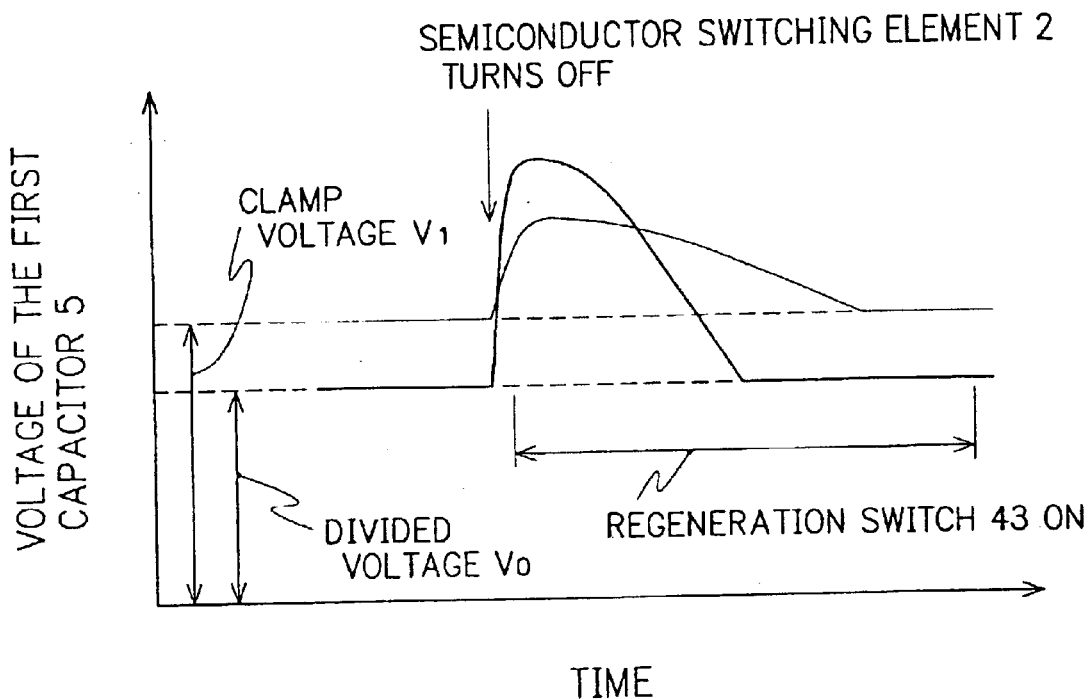
FIG. 17 is a waveform diagram showing voltage of the first capacitor 5.

Operation of the semiconductor switching device according to the present Embodiment is described with referring to FIG. 17. FIG. 17 is a waveform diagram showing voltage of the first capacitor 5 in relation to time in horizontal axis. In FIG. 17, voltage of the first capacitor 5 without the power regeneration switch 43, i.e. for the semiconductor switching device of FIG. 3 for example, is shown with a thin solid line. Also, voltage of the first capacitor 5 with the power regeneration switch 43 replacing the first diode 4, i.e. for the semiconductor switching device of the present Embodiment, is shown with a bold solid line.

When the semiconductor switching element 2 turns off, voltage surge occurs and energy of surge is stored into the first capacitor 5 together with energy supplied from power source, thereby voltage of the first capacitor 5 rises as shown in thin solid line in FIG. 17. In the semiconductor switching device without the power regenerating switch 43, electric charge for this raised voltage is consumed within the non-linear circuit 16 until the semiconductor switching element 2 turns on again, and voltage of the first capacitor 5 returns to the clamp voltage. Therefore, energy for this voltage rise of the first capacitor 5 is lost.

In the present Embodiment, however, the power regeneration switch 43 is controlled to be completely conductive, i.e. conductive in both directions, following the turn off of the semiconductor switching element 2. Thereby, energy stored in the first capacitor 5 is regenerated to the power source through the power regeneration switch 43, and voltage of the first capacitor 5 returns to the voltage of power source(or, in case semiconductor elements are connected in series, to the normal divided voltage $V_0$ of each semiconductor switching element 2) as shown with bold solid line in FIG. 17. Thereafter and before the semiconductor switching element turns on again, the power regeneration switch 43 is controlled to close conduction from the first capacitor 5 to the power source by a control signal or the like. To control the power regeneration switch 43 as described above, energy to be lost in a semiconductor switching device without power regeneration switch can be returned to the power source in the present Embodiment, thereby, the semiconductor switching device of low energy loss and high efficiency can be obtained.

Embodiment 14

Figure 18:
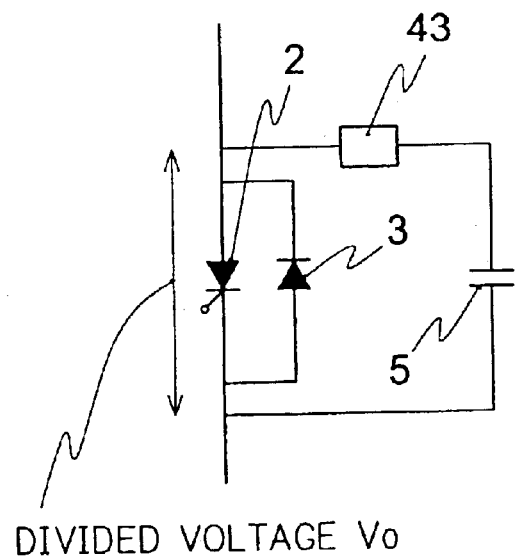
FIG. 18 is a circuit diagram showing Embodiment 14 of the present invention.

Embodiment 14 of the present invention is described with referring to FIG. 18. In FIG. 18, 2 denotes a semiconductor switching element, 3 denotes a reverse-conducting diode, 43 denotes a power regeneration switch, and 5 denotes a first capacitor. As shown in FIG. 18, the reverse-conducting diode is connected to the semiconductor switching element in parallel, while the power regeneration switch 43 and the first capacitor 5 are connected in series and connected in parallel to the semiconductor switching element 2.

Even in a semiconductor switching device as shown in FIG. 18, that is, without non-linear circuit 16, energy to be lost in a semiconductor switching device without power regeneration switch can be returned to the power source by controlling the power regeneration switch 43 as described in the above Embodiment 13. Accordingly, the semiconductor switching device of low energy loss and high efficiency can be obtained.

Embodiment 15

Figure 19A:
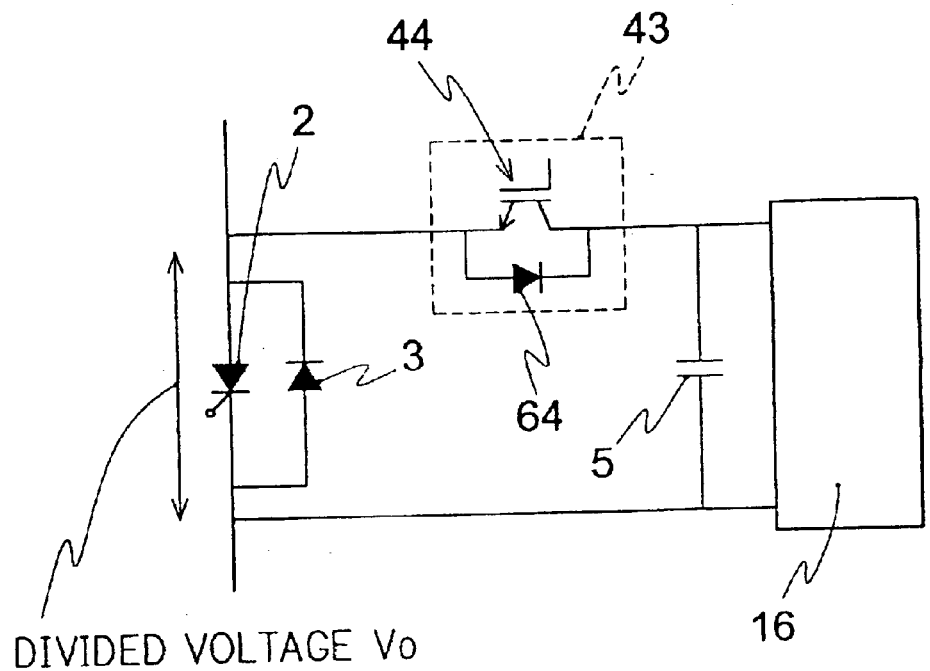
FIGS. 19(*a*) and 19(*b*) are circuit diagrams showing Embodiment 15 of the present invention.
Figure 19B:
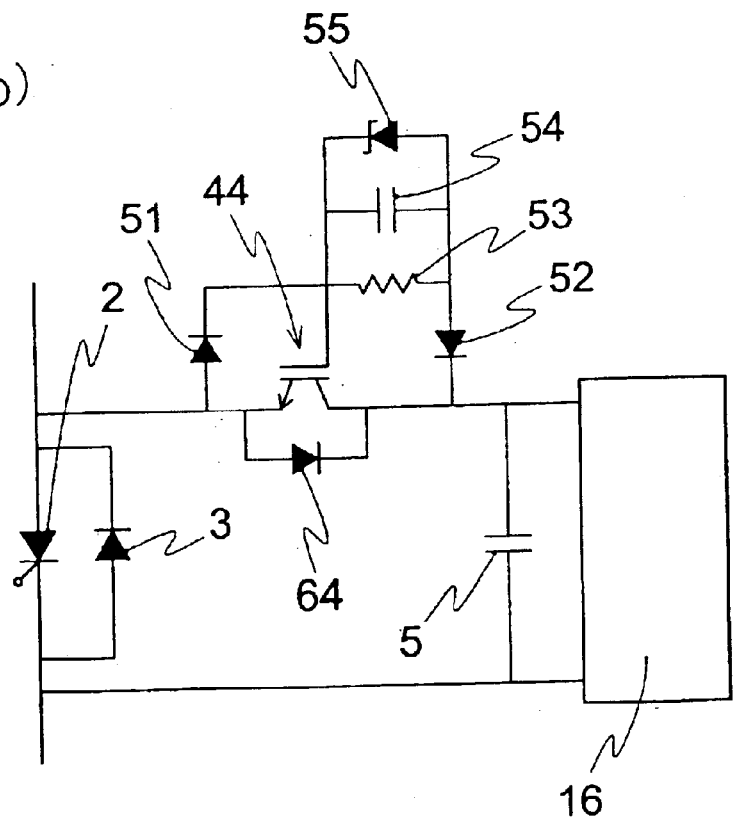

Embodiment 15 of the present invention is described with referring to FIGS. 19(a) and 19(b). As shown in FIG. 19(a), the power regeneration switch 43 comprises a switching element 44 and second diode 64. For the switching element 44, an IGBT, FET, another conventional transistor, GTO, GCT or the like is applicable, and the second diode 64 may be integrated with the switching element 44.

Operation of the semiconductor switching device according to the present Embodiment is described with referring to FIG. 19(a). As is apparent from the FIG. 19(a), the power regeneration switch 43 always allows current flow in the forward direction of the second diode 64. Therefore, energy of surge caused by turn off of the semiconductor switching element 2 flows easily through the second diode 64 and stored into the first capacitor 5. Following the turn off of the semiconductor switching element 2, moreover, a control signal is applied to the switching element 44 to turn it on, so that the power regeneration switch 43 allows current flow from the first capacitor 5 towards the power source through the switching element 44. Thereby, electric charge of the first capacitor 5 for exceeding the voltage of power source (or the normal divided voltage $V_0$) is returned to the power source. Thereafter and before the semiconductor switching element 2 turns on again, a control signal is applied to the switching element 44 to turn it off. By controlling the switching element 44 as described above, electric charge stored in the first capacitor 5 can be regenerated to the power source so that the semiconductor switching device of low energy loss and high efficiency can be obtained.

In FIG. 19(b), a circuit to automatically control the switching element 44 is shown by way of example. In FIG. 19(b), 51 denotes the fourth diode, 52 denotes the fifth diode, 53 denotes a resistor for controlling the regeneration, 54 denotes a capacitor to accumulate a regeneration signal, and 55 denotes a Zener diode to control the regeneration.

When the semiconductor switching element 2 turns off, the capacitor 54 is charged to the voltage determined by the Zener diode 55 and thereafter, that is, shortly after turn off of the semiconductor switching element 2, the charged voltage of the capacitor 54 turns the switching element 44 on. Energy of surge stored in the first capacitor 5 flows through the switching element 44 and regenerated to the power source.

Embodiment 16

Figure 20:
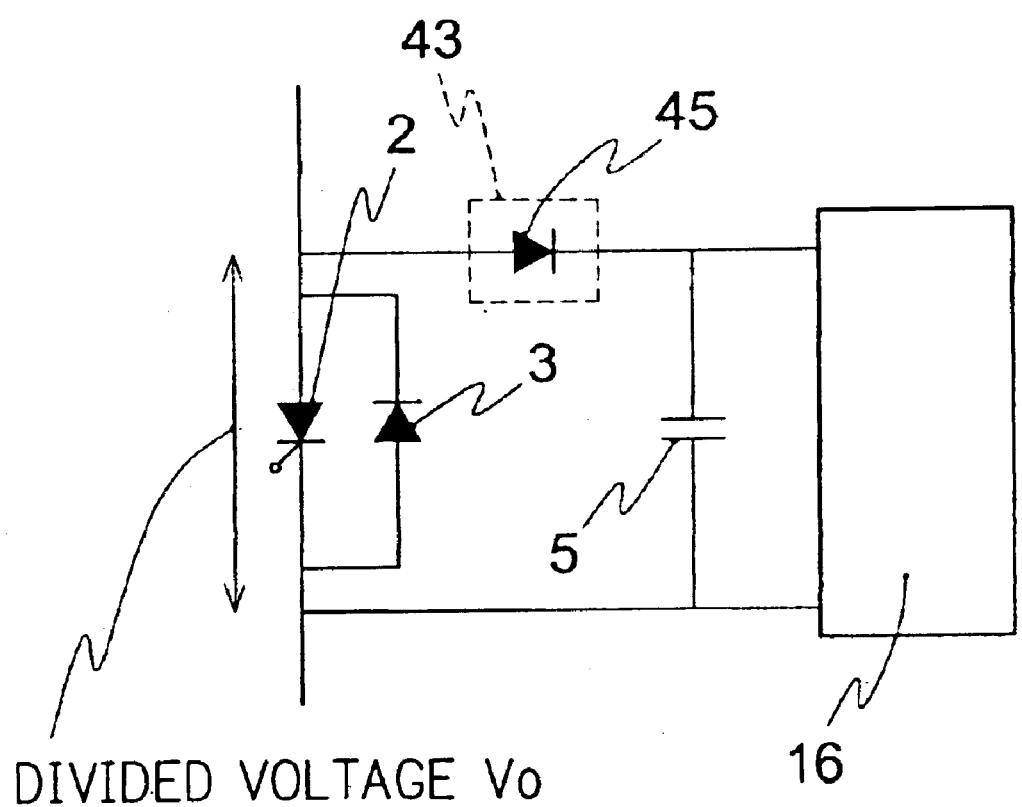
FIG. 20 is a circuit diagram showing Embodiment 16 of the present invention.

Embodiment 16 of the present invention is described with referring to FIG. 20. In the present Embodiment, the power regeneration switch 43 comprises a large Qrr diode 45 in which relatively large amount of charge, i.e. 10 percent or more of the charge flowed forwardly therethrough when the switching element 2 turns off, flows reversely during reverse recovery time thereof.

Figure 21A:
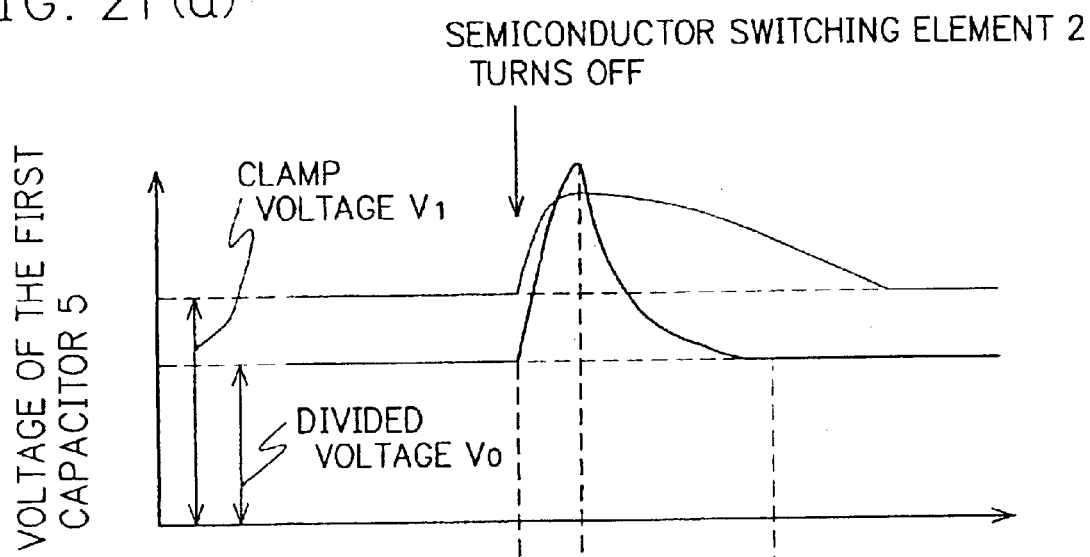
FIG. 21(*a*) is a waveform diagram showing voltage of a first capacitor, and FIG. 21(*b*) is a waveform diagram showing current through a second capacitor.
Figure 21B:
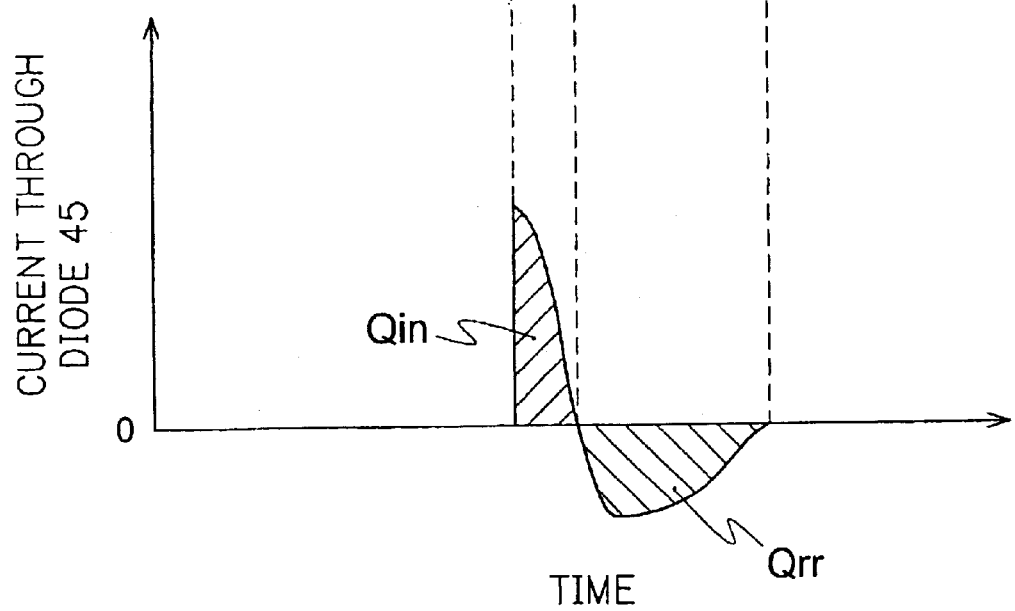

Operation of the semiconductor switching device according to the present Embodiment is described with referring to FIGS. 21(a) and 21(b). In FIGS. 21(a) and 21(b), voltage of the first capacitor 5 and current flowing through the large Qrr diode 45 are shown respectively in relation to time in horizontal axis.

In FIG. 21(a), voltage of the first capacitor 5 without the power regeneration switch 43 is shown with a thin solid line, and voltage of the first capacitor 5 with the power regeneration switch 43 comprising the large Qrr diode 45 is shown with a bold solid line.

As already discussed above, by turning off the semiconductor switching element 2, current flows into the first capacitor 5 to raise the voltage thereof. At this time, charge Qin flows forwardly through the large Qrr diode 45 as shown in FIG. 21. Consequently, the voltage of the first capacitor 5 exceeds the voltage of power source (or the normal divided voltage $V_0$) so that the large Qrr diode 45 is reversely biased and, thereby, reverse current flows therethrough during the reverse recovery time thereof toward the power source. Therefore, by using a large Qrr diode 45 in which reverse recovery charge Qrr of this reverse current is large, energy to be lost in a semiconductor switching device without power regeneration switch can be returned to the power source. Accordingly, the semiconductor switching device of low energy loss and high efficiency can be obtained.

Figure 22:
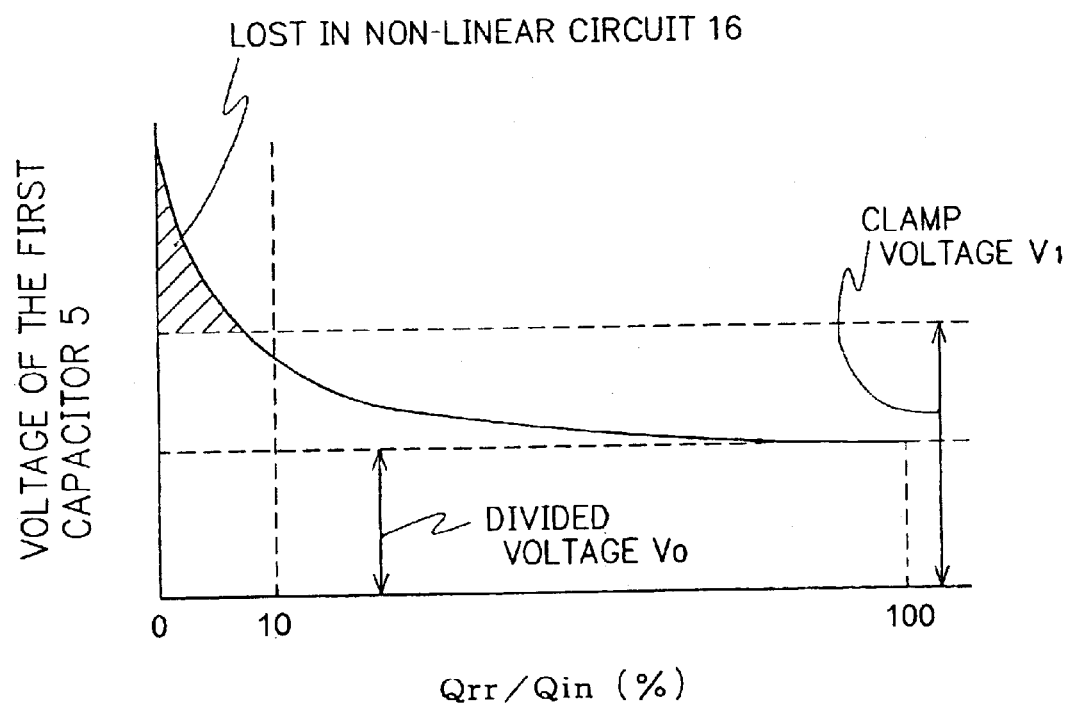
FIG. 22 is a diagram showing relation between reverse recovery charge Qrr and loss at the non-linear circuit 16.

Relation between ratio of Qrr to Qin (ratio of reverse recovery charge regenerated toward the power source to flow-in charge flowed into the first capacitor 5) and the voltage of the first capacitor 5 as well as loss in the non-linear circuit 16 is described with referring to FIG. 22.

When the semiconductor switching element 2 turns off, energy of surge mainly owing to inductance of wiring in power system is absorbed into the first capacitor 5. At the same time, moreover, energy from the power source is also absorbed into the first capacitor 5 together with the energy of surge. These energy, i.e. flow-in charge Qin of surge and power source, raise the voltage of the first capacitor 5. Thereby, the voltage of the first capacitor 5 exceeds the normal divided voltage $V_0$ so that the large Qrr diode 45 reversely conducts current toward the power source. The reverse recovery charge Qrr is calculated as an integral of this reverse current.

As shown in a hatched portion in FIG. 22, if a diode in which reverse recovery charge Qrr regenerated to the power source is very small is used, charge for voltage of the first capacitor 5 exceeding the clamp voltage $V_1$ flows into the non-linear circuit 16 and being lost, so that the voltage of the first capacitor 5 returns to the clamp voltage $V_1$. While in case the diode 45 of large Qrr, i.e. diode in which ratio of Qrr to Qin is 10 percent or more, is used, energy is regenerated from the first capacitor 5 to the power source so that the voltage of the first capacitor 5 is controlled below the clamp voltage $V_1$ and, thereby, the loss in the non-linear circuit is eliminated or reduced. Moreover, in case such diode wherein ratio of Qrr to Qin is 100 percent is used, energy from the power source is almost completely regenerated and only energy of surge owing to the floating inductance is lost and can not be regenerated.

Embodiment 17

Figure 23:
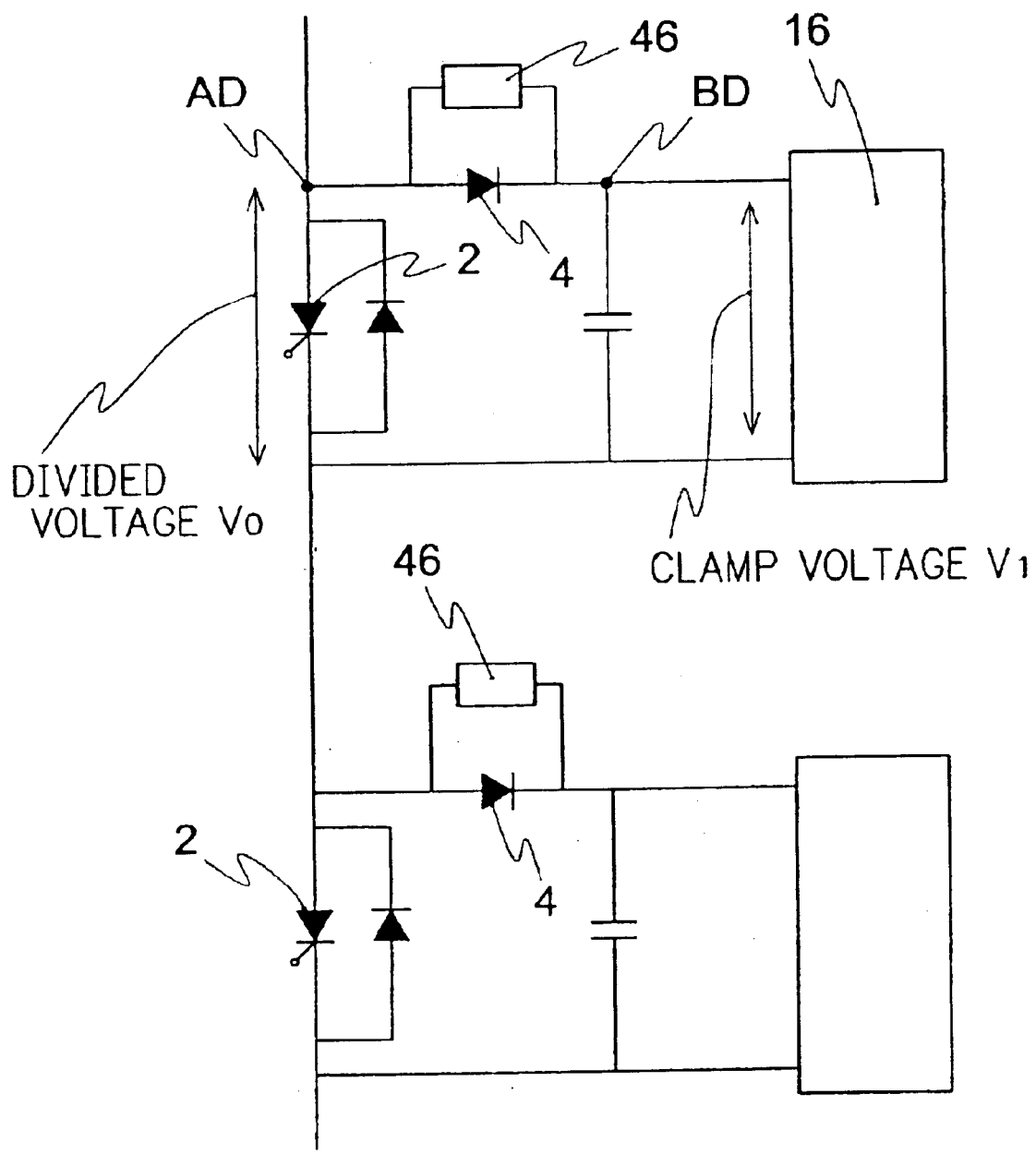
FIG. 23 is a circuit diagram showing Embodiment 17 of the present invention.

Embodiment 17 of the present invention is described with referring to FIG. 23. In FIG. 23, 46 denotes a delay device connected in parallel to the first diode 4. Moreover, voltage on anode of the first diode 4 is shown with "AD" and voltage on cathode of the first diode 4 is shown with "BD" in FIG. 23.

Figure 24:
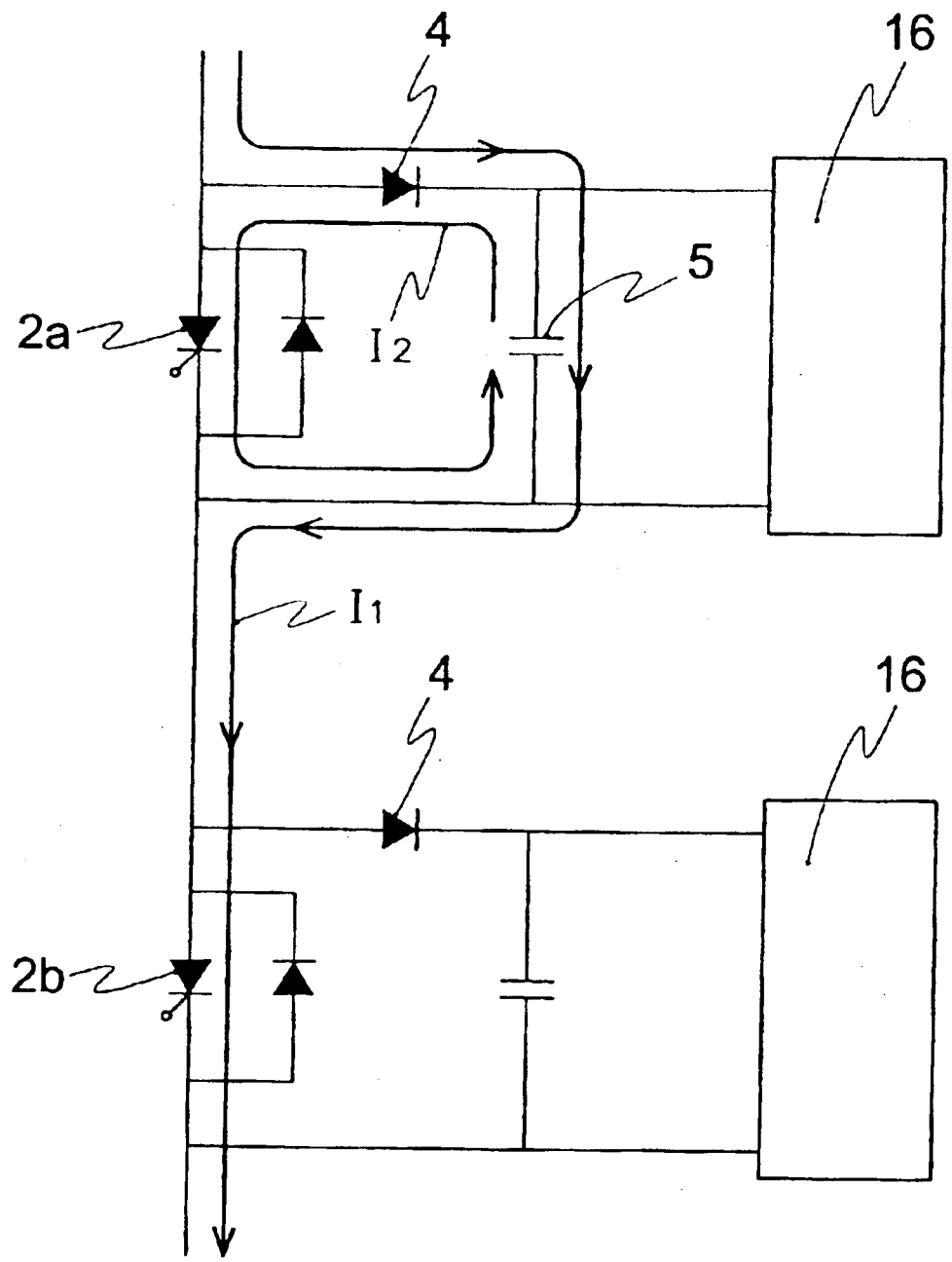
FIG. 24 is a diagram showing operation of the semiconductor switching device without diode-on delay device.

In the semiconductor switching device wherein the semiconductor switching elements 2 are connected in series such as shown in FIG. 10, turn on of each semiconductor switching elements 2 may not be synchronized and, thereby, the first diode 4 for the semiconductor switching element of late turn on may be broken. This circumstance is described more in detail with referring to FIG. 24. In FIG. 24, it is assumed that the semiconductor switching element 2b turns on first and, thereafter, the semiconductor switching device 2a turns on.

For the semiconductor switching elements 2a, 2b in their off state, the semiconductor switching element 2b turns on firstly. At this time, since the semiconductor switching element 2a is still off, current $I_1$ is drawn through the first diode 4, the first capacitor 5 for the semiconductor switching element 2a, and the semiconductor switching element 2b itself as shown with an arrow $I_1$ in FIG. 24. Afterward, the semiconductor switching element 2a turns on and the current shifts its path to flow through the semiconductor switching elements 2a and 2b, thereby, reverse current $I_2$ occurs in the snubber circuit for the semiconductor switching element 2a as shown with an arrow $I_2$ in FIG. 24. In case this reverse current $I_2$ flows, the first diode 4 checking the reverse current $I_2$ may be broken.

In the present Embodiment, therefore, the delay device 46 is provided in parallel with the first diode 4 as shown in FIG. 23. With the delay device 46, it takes more time until voltage AD on anode of the first capacitor 5 reaches or exceeds voltage BD on cathode thereof, that is, turn on of the first diode 4 is delayed. Accordingly, the semiconductor switching element 2a turns on earlier than the first diode 4 so that the current $I_1$ through the first diode 4 never flows, and also, the reverse current $I_2$ never flows. Therefore, a safe and secure semiconductor switching device, in which breakdown of the first diode 4 is prevented, is obtained.

FIG. 25 shows the present Embodiment more in detail by way of example. As show in FIG. 25, the delay device 46 comprises a by-pass resistor 47 and a reverse charged capacitor 48. The by-pass resistor is to control current flowing through the delay device 46, and the reverse charged capacitor 48 is charged to the voltage of the first capacitor 5 for keeping the first diode 4 reversely biased.

Operation of the delay device 46 shown in FIG. 25 is described. As already discussed above, the first capacitor 5 is charged with the clamp voltage $V_1$ so that voltage thereof is higher than the normal divided voltage $V_0$. Since voltage BD equals to the voltage of the first capacitor 5 and voltage AD equals to the normal divided voltage $V_0$, the voltage BD is larger than the voltage AD, i.e. BD>AD, so that the first diode 4 is reversely biased and in off state.

In case the semiconductor switching element 2b turns on leaving the semiconductor switching element 2a off, the current $I_1$ discussed in FIG. 24 is going to flow. However, current does not flow through the first diode 4 but through the by-pass resistor 47 and the reverse charged capacitor 48. Thereby, the reverse charged capacitor 48 is charged to raise the voltage AD in proportion to said current and flowing term thereof. If the voltage AD rises and reaches to the voltage BD, the first diode 4 turns on to flow the current $I_1$ therethrough. However, since the semiconductor switching element 2a turns on before the voltage AD reaches the voltage BD, the voltage AD never reaches the voltage BD so that the current $I_1$ through the first diode 4 never flows. Therefore, the reverse current $I_2$ never occurs and a safe and secure semiconductor switching device, in which breakdown of the first diode 4 is prevented, is obtained.

According to the first aspect of the present invention, since voltage applied to the semiconductor switching element is lower than voltage of the clamp capacitor connected in parallel thereto, surge energy owing to the turn off of the semiconductor switching elements hardly flows into the clamp capacitor so that current causing loss is reduced to obtain a semiconductor switching device of low loss and high efficiency.

According to the second aspect of the present invention, since the first capacitor is provided to absorb energy caused by the turn off operation and the clamp voltage is set to approximately 1.3 times of the normal divided voltage for the semiconductor switching element, the first capacitor of high withstand voltage is not required and protection for the semiconductor switching element is achieved even if voltage of the power source rises by an accident so that a semiconductor switching device of low loss, low cost and space saving.

According to the second aspect of the present invention, even if some of the series-connected semiconductor switching elements are broken down to rise voltage of the other series-connected semiconductor switching element to 1.3 times or more of normal divided voltage, current flowing through the non-linear unit can be controlled by selecting the first impedance element of adequate impedance so that a semiconductor switching device of high reliability in which the non-linear unit is protected can be obtained.

In the semiconductor switching elements connected in series, leakage current in their off state are not equal each other so that voltage for some semiconductor switching elements are higher than the others. In the prior art semiconductor switching device, therefore, a resistor is connected in parallel to the respective semiconductor switching element as a voltage divider and current larger than the leakage current is drawn therethrough to equalize divided voltage among semiconductor switching elements so that considerably large loss is caused at the resistor and not negligible. According to the fourth aspect of the present invention, however, compensating current is drawn by the second Zener diode, the second controlling semiconductor element and the second resistor to suppress the voltage of the semiconductor switching element when unusual voltage larger than normal divided voltage is applied to the semiconductor switching element. Thereby, the normal divided voltage is equalized among the series-connected semiconductor switching elements and a semiconductor switching device of high stability and lower loss is obtained.

According to the fifth aspect of the present invention, since the second impedance element is connected to between two non-linear units, voltage transition exceeding the normal divided voltage is managed by two non-linear units while the normal divided voltage in off state is equalized by the non-linear unit and the second impedance element. Therefore, components of the semiconductor switching device can be reduced so that a device of low cost, space saving and high efficiency is obtained.

According to the sixth aspect of the present invention, since the second impedance element comprises a third diode and the third resistor, unnecessary discharge from the first capacitor is prevented so that a semiconductor switching device of stable, low cost, space saving and high efficiency, in which divided voltage in off state is equalized and voltage at the turn off is clamped, is obtained.

According to the seventh aspect of the present invention, since the second clamp voltage, at which compensating current begins to flow, is set to be lower than equally divided normal divided voltage, so that the compensating current start to flow when voltage of the semiconductor switching element exceeds the second clamp voltage and is adjusted to be moderate at the normal divided voltage. Thereby, the normal divided voltage among the series-connected semiconductor switching elements are equalized and a semiconductor switching device of stable, low cost and space saving is obtained.

According to the eighth aspect of the present invention, the second impedance element to flow compensating current is not provided for a semiconductor switching element in which resistance in off state thereof is the smallest among the series-connected semiconductor switching elements. Divided voltage of the other switching element having the second impedance element closes to the normal divided voltage of the semiconductor element having smallest resistance so that divided voltage of the semiconductor switching elements are equalized and a semiconductor switching device of stable, low cost, space saving and high efficiency is obtained.

According to the ninth aspect of the present invention, since the resistor of the second impedance element is variable, it becomes possible to make divided voltage among the semiconductor switching elements more equally. Therefore, a semiconductor switching device of stable, low cost, space saving and high efficiency is obtained.

According to the tenth aspect of the present invention, since the first capacitor charged under operation is used as a power source for the gate drive circuit, it is unnecessary to provide a power source for the gate drive circuit exclusively so that a semiconductor switching device of low cost, space saving and lower loss is obtained.

According to the eleventh aspect of the present invention, since the second capacitor charged with the some of the non-linear units is used as a power source for the gate drive circuit, voltage transformation to obtain an adequate voltage for the gate drive circuit is easy so that exclusive power source for the gate drive circuit is unnecessary and a semiconductor switching device of low cost, space saving and lower loss is obtained.

According to the twelfth aspect of the present invention, since two first capacitor are provided and one of them is used as a power source for the gate drive circuit, voltage transformation to obtain an adequate voltage for the gate drive circuit is easy so that exclusive power source for the gate drive circuit is unnecessary and a semiconductor switching device of low cost, space saving and lower loss is obtained.

According to the thirteenth aspect of the present invention, since the first diode is replaced with a power regeneration switch which comprises a diode having the same forward direction as the first diode and a switching element connected in parallel thereto, energy stored into the first capacitor is regenerated to the power source through the switching element being conductive so that a semiconductor switching device of lower loss is obtained. Moreover, since it is unnecessary to set voltage of the first capacitor higher than voltage of power source (or normally divided voltage of each semiconductor switching element) for reducing loss, voltage of the first capacitor remains lower so that life of the first diode limited by the LTDS is extended and a stable semiconductor switching device is obtained.

According to the fourteenth aspect of the present invention, since a large Qrr diode, in which reverse recovery charge is large, is used as the first diode, charge Qrr almost same as charge Qin, which flowed into the first capacitor when the semiconductor switching element turned on, is regenerated to the power source during reverse recovery period thereof. Therefore, energy to be lost at the non-linear circuit in a prior art semiconductor switching device can be regenerated to the power source so that a semiconductor switching device of lower loss is obtained.

In the semiconductor switching device according to the fifteenth aspect of the present invention, since a diode-on delay device is connected to the first diode in parallel, current does not flow through the first diode and the first capacitor connected to the semiconductor switching element of late turn on even if turn on of the semiconductor switching elements are not synchronized. Therefore, reverse current in the snubber circuit caused by late turn on of the semiconductor switching element does not happens so that the first diode of the snubber circuit is not broken. Accordingly, safe and reliable semiconductor switching device can be obtained regardless of the asynchronous turn on among the semiconductor switching elements.

While there has been described what is at present considered to be preferred embodiment of the invention, it will be understood that various modifications may be made therein, and it is intended to cover in the appended claims all such modifications as fall within the true spirit and scope of the invention.

What is claimed is:

1. A semiconductor switching device comprising:
    self-quenching semiconductor switching elements connected in series, and
    snubber circuits connected in parallel to respective semiconductor switching elements, each snubber circuit comprising a diode and a capacitor connected in series, and a non-linear circuit connected in parallel with the capacitor, said non-linear circuit drawing current when an applied voltage exceeds a clamp voltage, wherein the clamp voltage is at least 1.27 times larger than a divided voltage normally applied to each of the semiconductor elements, and which is larger than a divided voltage applied to one of the semiconductor elements during a fault in a power system, wherein
    the non-linear circuit comprises an impedance element and at least one non-linear unit, each non-linear unit comprising
        a Zener diode having a cathode, an anode, and a Zener voltage,
        a resistor, and
        a controlling semiconductor element having a collector, an emitter, and a gate,
    the impedance element, the Zener diode, and the resistor are connected in series, the cathode and the anode of the Zener diode are connected to the collector and the gate of the controlling semiconductor element, respectively, the resistor is connected between the gate the emitter of the controlling semiconductor element, and the clamp voltage is a sum of the Zener voltages of each of the Zener diodes, and
    one of (i) impedance of the impedance element and (ii) number of the controlling semiconductor elements is adjusted so that loss in the controlling semiconductor element due to a current flowing through the controlling semiconductor element when the divided voltage applied to the semiconductor switching element due to a fault in a power system exceeds the clamp voltage, does not exceed power dissipation capacity of the controlling semiconductor element.

2. The semiconductor switching device of claim 1, including a diode-on delay device connected to the diode, in parallel.

3. A semiconductor switching device comprising:
    a self-quenching semiconductor switching element, and
        a compensation circuit connected in parallel with the self-quenching semiconductor switching element, said compensation circuit comprising
        an impedance element,
        a Zener diode having a cathode, an anode, and a Zener voltage,
        a resistor, and
        a controlling semiconductor element,
    wherein said controlling semiconductor element, which draws current when a voltage applied to the Zener diode exceeds the Zener voltage has a collector connected to the cathode-of the Zener diode, a gate connected to the anode of the Zener diode and a first end of the resistor, and an emitter connected to a second end of the resistor.

4. A semiconductor switching device comprising:
    self-quenching semiconductor switching elements connected in series, and
    snubber circuits connected in parallel to respective semiconductor switching elements, each snubber circuit comprising a diode and a capacitor connected in series, and a non-linear circuit connected in parallel with the capacitor, said non-linear circuit drawing current when an applied voltage exceeds a clamp voltage, wherein the clamp voltage is at least 1.27 times larger than a divided voltage normally applied to each of the semiconductor elements, and which is larger than a divided voltage applied to one of the semiconductor elements during a fault in a power system, wherein input terminals of a DC voltage converter are connected in parallel to the capacitor, and output terminals of the DC converter are connected to power input terminals of a gate drive circuit for driving the semiconductor switching elements, the DC voltage converter converting a voltage stored in the capacitor to a voltage driving a source controlling at least one of the self-quenching semiconductor switching elements.

5. A semiconductor switching device comprising:

self-quenching semiconductor switching elements connected in series, and snubber circuits connected in parallel to respective semiconductor switching elements, each snubber circuit comprising a diode and a capacitor connected in series, and a non-linear circuit connected in parallel with the capacitor, said non-linear circuit drawing current when an applied voltage exceeds a clamp voltage, wherein the clamp voltage is at least 1.27 times larger than a divided voltage normally applied to each of the semiconductor elements, and which is larger than a divided voltage applied to one of the semiconductor elements during a fault in a power system, wherein the non-linear circuit comprises series connected non-linear units and the capacitor comprises series connected capacitors, each of which is connected in parallel with one of the non-linear units, input terminals of a DC voltage converter are connected in parallel to at least one of the capacitors at a lower voltage side, and output terminals of the DC voltage converter are connected to power input terminals of a gate drive circuit for driving the semiconductor switching elements, the DC voltage converter converting a voltage stored in the capacitor to a voltage driving a source controlling at least one of the self-quenching semiconductor switching elements.

6. A semiconductor switching device comprising:

self-quenching semiconductor switching elements connected in series, and snubber circuits connected in parallel to respective semiconductor switching elements, each snubber circuit comprising a diode and a capacitor connected in series, and a non-linear circuit connected in parallel with the capacitor, said non-linear circuit drawing current when an applied voltage exceeds a clamp voltage, wherein the clamp voltage is a least 1.27 times larger than a divided voltage normally applied to each of the semiconductor elements, and which is larger than a divided voltage applied to one of the semiconductor elements during a fault in a power system, wherein the diode is a large Qrr diode, in which reverse recovery charge is at least 10 percent of forwardly flowing charge when the semiconductor switching element turns off.

* * * * *